United States Patent
Hwang

(10) Patent No.: US 8,921,930 B2
(45) Date of Patent: Dec. 30, 2014

(54) SEMICONDUCTOR DEVICE WITH BURIED BIT LINE AND METHOD FOR FABRICATING THE SAME

(71) Applicant: SK Hynix Inc., Gyeonggi-do (KR)

(72) Inventor: Eui-Seong Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/145,430

(22) Filed: Dec. 31, 2013

(65) Prior Publication Data

US 2014/0110781 A1    Apr. 24, 2014

Related U.S. Application Data

(62) Division of application No. 13/554,739, filed on Jul. 20, 2012, now Pat. No. 8,643,096.

(30) Foreign Application Priority Data

Mar. 12, 2012 (KR) ......................... 10-2012-0024914

(51) Int. Cl.
*H01L 29/76* (2006.01)
*H01L 29/94* (2006.01)
*H01L 31/062* (2012.01)
*H01L 31/113* (2006.01)
*H01L 31/119* (2006.01)
*H01L 27/108* (2006.01)
*H01L 29/786* (2006.01)

(52) U.S. Cl.
CPC .... *H01L 27/10814* (2013.01); *H01L 27/10885* (2013.01); *H01L 29/78642* (2013.01); *H01L 27/10876* (2013.01)
USPC ............... 257/330; 257/E21.41; 257/E29.262

(58) Field of Classification Search
CPC .................................................. H01L 27/10814
USPC ............................ 257/330, E21.41, E29.262
See application file for complete search history.

(56) References Cited

U.S. PATENT DOCUMENTS

2011/0156118 A1* 6/2011 Park .............................. 257/306
2013/0240965 A1* 9/2013 Park et al. ..................... 257/296

* cited by examiner

*Primary Examiner* — David S Blum
(74) *Attorney, Agent, or Firm* — IP & T Group LLP

(57) ABSTRACT

A semiconductor device includes trenches defined in a substrate, buried bit lines partially filling the trenches, a first source/drain layer filling remaining portions of the trenches on the buried bit lines, stack patterns having a channel layer and a second source/drain layer stacked therein and bonded to the first source/drain layer, wherein the channel layer contacts with the first source/drain layer, and word lines crossing with the buried bit lines and disposed adjacent to sidewalls of the channel layer.

11 Claims, 30 Drawing Sheets

SEMICONDUCTOR DEVICE WITH BURIED BIT LINE AND METHOD FOR FABRICATING THE SAME

CROSS-REFERENCE TO RELATED APPLICATIONS

This application is a division of U.S. patent application Ser. No. 13/554,739, now U.S. Pat. No. 8,643,096, filed on Jul. 20, 2012, which claims priority of Korean Patent Application No. 10-2012-0024914, filed on Mar. 12, 2012. The disclosure of each of the foregoing application is incorporated herein by reference in its entirety.

BACKGROUND

1. Field

Exemplary embodiments of the present invention relate to a semiconductor device fabricating technology, and more particularly, to a semiconductor device with buried bit lines and a method for fabricating the same.

2. Description of the Related Art

As the degree of integration of a semiconductor memory device has increased, in order to reduce a plane area occupied by a unit cell, a cell structure has been changed from $8F^2$ and $6F^2$ to $4F^2$ ($F^2$: cell size factor). Various methods for forming other component elements such as transistors/bit lines, word lines, capacitors, etc, in step with such reduction in the area of the unit cell have been suggested. In particular, in order to realize a $4F^4$ cell structure, a vertical channel semiconductor device has been proposed, in which a source and a drain are disposed up and down to induce a vertical channel.

In the vertical channel semiconductor device, a gate electrode is formed around an active pillar which vertically extends from the main surface of a substrate and a source and a drain are formed in the upper and lower parts of the active pillar with the gate electrode disposed therebetween, by which a channel is vertically formed from the main surface of the substrate. Accordingly, even when the area of the semiconductor device is reduced, a channel length may not be adversely influenced.

In realizing the vertical channel semiconductor device in this way, a buried bit line structure has been disclosed, in which a bit line is buried under an active pillar.

In the conventional art, a buried bit line is formed in such a way that impurity ions are implanted into a substrate between active pillars to form an impurity region and the substrate is etched between the active pillars to separate the impurity region. However, the resistance of the buried bit line may increase due to limitations in the doping concentration of the impurity.

Although the resistance of the buried bit line may be reduced by forming the buried bit line using a metallic layer with low resistance, it may be difficult to apply such a method in terms of a structural aspect. For instance, in order to use a metal as a buried bit line, a method has been suggested, in which a buried bit line is formed by forming a contact (so called a one side contact: OSC) in such a way as to expose one sidewall of an active pillar. Nevertheless, the buried bit line with the OSC structure may have a complicated fabrication procedure, and require high difficulty fabricating technologies, and thus, it may be not easy to adapt the method for mass production.

SUMMARY

Exemplary Embodiments of the present invention are directed to a semiconductor device with buried bit lines and a method for fabricating the same.

In accordance with an exemplary embodiment of the present invention, a semiconductor device includes trenches defined in a substrate, buried bit lines partially filling the trenches, a first source/drain layer filling remaining portions of the trenches on the buried bit lines, stack patterns having a channel layer and a second source/drain layer are stacked therein and bonded to the first source/drain layer, wherein the channel layer contacts with the first source/drain layer, and word lines crossing with the buried bit lines and disposed adjacent to sidewalls of the channel layer.

In accordance with another exemplary embodiment of the present invention, a semiconductor device includes a first structure including first trenches which are defined in a substrate, buried bit lines which partially fill the first trenches, and a first source/drain layer which fills remaining portions of the first trenches on the buried bit lines, and a second structure including stack patterns having a channel layer and a second source/drain layer are stacked therein, second trenches which expose sidewalls of the channel layer, word lines which are filled in the second trenches and a dielectric layer which gap-fills spaces between the word lines, wherein the buried bit lines and the word lines cross with each other, and the first source/drain layer and the channel layer contact with each other.

In accordance with yet another exemplary embodiment of the present invention, a method for fabricating a semiconductor device includes defining trenches in a substrate forming buried bit lines to partially fill the trenches forming a first source/drain layer to fill remaining portions of the trenches on the buried bit lines sequentially forming a second source/drain layer and a channel layer on an entire surface of a sacrificial substrate, bonding the substrate and the sacrificial substrate with each other for the first source/drain layer and the channel layer to face each other, removing the sacrificial substrate, forming stack patterns by selectively etching the second source/drain layer and the channel layer for the etched channel layer to contact with the first source/drain layer, and forming word lines to cross with the buried bit lines and be disposed adjacent to sidewalls of the channel layer.

In accordance with still another exemplary embodiment of the present invention, a method for fabricating a semiconductor device includes defining first trenches in a substrate, forming buried bit lines to partially fill the first trenches, forming a first source/drain layer to fill remaining portions of the first trenches on the buried bit lines, forming stack patterns having a second source/drain layer and a channel layer are stacked therein on a sacrificial substrate, forming a dielectric layer on the sacrificial substrate to fill spaces between the stack patterns and have second trenches which expose sidewalls of the channel layer; forming word lines to fill the second trenches, bonding the substrate and the sacrificial substrate with each other, wherein the buried bit lines and the word lines cross with each other and the first source/drain layer and the channel layer face each other, and removing the sacrificial substrate.

According to the exemplary embodiments of the present invention, since other structures (for example, a channel layer and word lines) are bonded to a substrate in which buried bit lines are formed, low resistance buried bit lines may be easily realized, and the capacitance between adjacent buried bit lines may be reduced.

Furthermore, according to the exemplary embodiments of the present invention, because a plurality of component elements constituting a vertical channel semiconductor device are separately fabricated on individual substrates and then the individual substrates are bonded with each other, structures may be simple, whereby it may be easy to increase the degree of integration, processes may be simplified, processing difficulties may be lessened, and applicability for mass production may be improved.

DETAILED DESCRIPTION

Figure 1A:
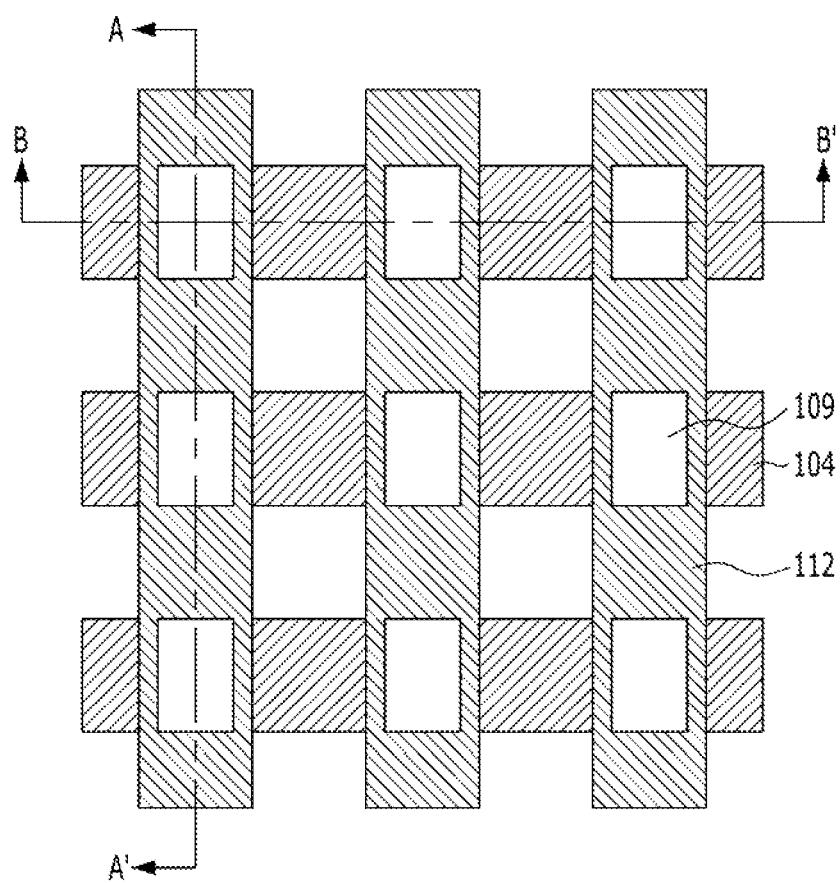
FIGS. 1A to 1C are views illustrating a semiconductor device in accordance with a first embodiment: of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to dearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

The following embodiments of the present invention provide vertical channel semiconductor devices with buried bit lines (BBL), which may easily realize low resistance buried bit lines and reduce capacitance between adjacent buried bit lines. To this end, in the embodiments of the present invention, a plurality of component elements constituting a vertical channel semiconductor device are separately fabricated on individual substrates (for example, by separating buried bit lines and word lines from each other) and then the individual substrates are bonded with each other to realize the vertical channel semiconductor device.

Figure 1B:
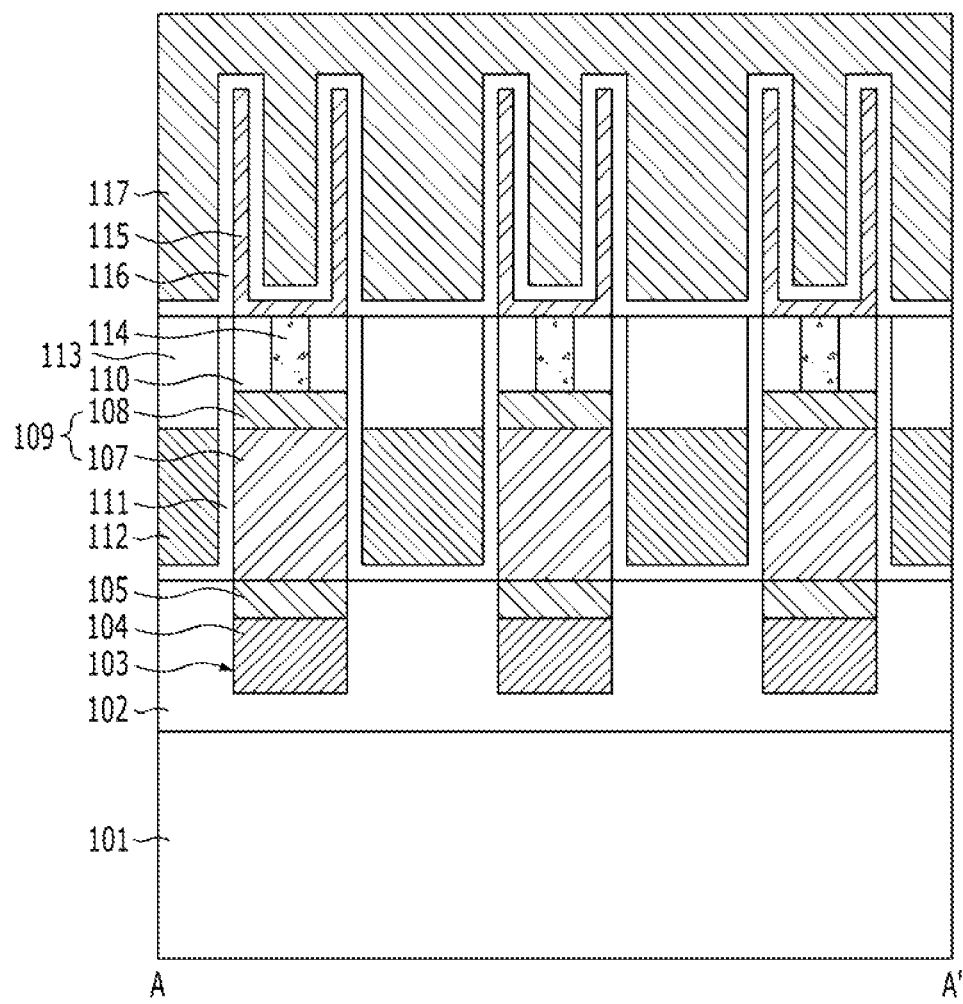
Figure 1C:
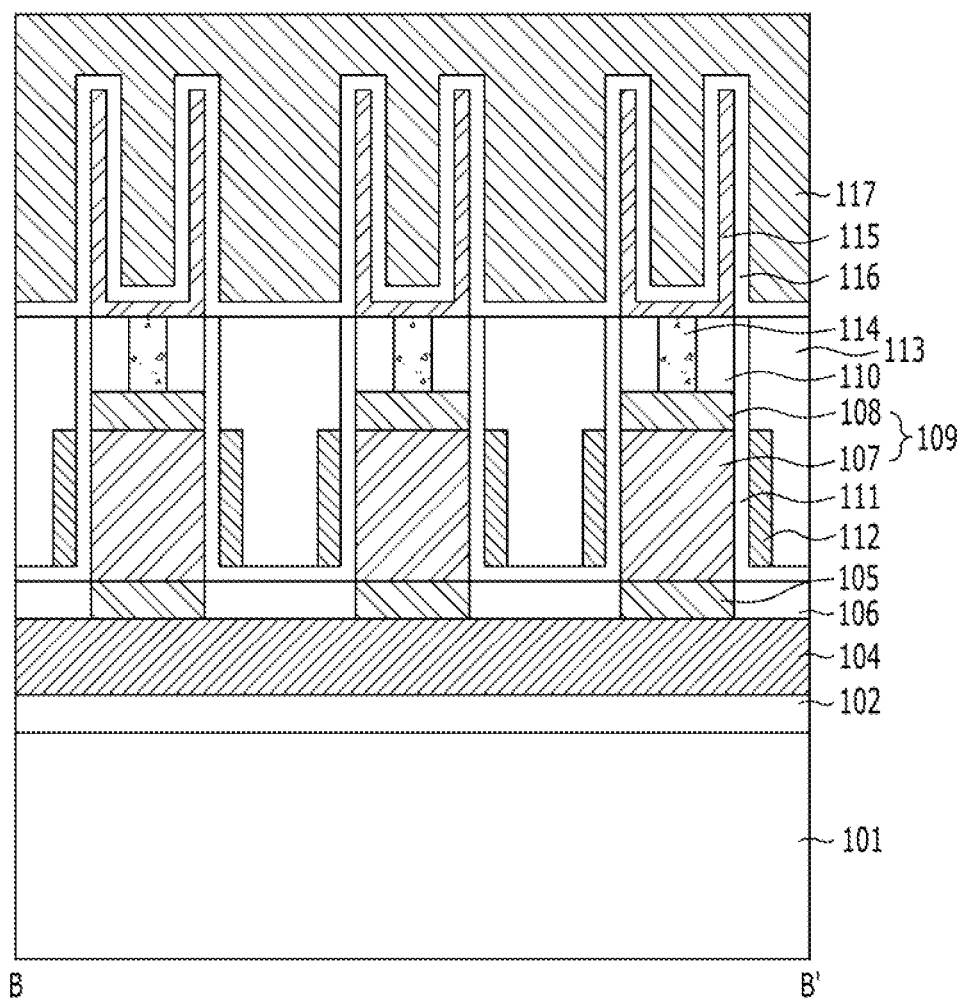

FIGS. 1A to 1C are views illustrating a semiconductor device in accordance with a first embodiment of the present invention. FIG. 1A is a plan view, FIG. 1B is a cross-sectional view taken along the line A-A' of FIG. 1A, and FIG. 1C is a cross-sectional view taken along the line B-B' of FIG. 1A.

Referring to FIGS. 1A to 1C, a semiconductor device in accordance with a first embodiment of the present invention includes trenches 103 which are defined in a substrate 101, buried bit lines 104 which partially fill the trenches 103, a first source/drain layer 105 which fills the remaining portions of the trenches 103 on the buried bit lines 104, stack patterns 109 having a structure, which a channel layer 107 and a second source/drain layer 108 are stacked in, and bonded to the first source/drain layer 105 such that the channel layer 107 contacts with the first source/drain layer 105, and word lines 112 which cross with the buried bit lines 104 and are disposed adjacent to the sidewalls of the channel layer 107.

The trenches 103 are to provide spaces in which the buried bit lines 104 and the first source/drain layer 105 are to be formed, and the trenches 103 may be line type patterns which extend in the B-B' direction. In order to electrically isolate adjacent buried bit lines 104 from each other and the buried bit lines 104 and the substrate 101 from each other, the trenches 103 may be defined in a first dielectric layer 102 which is formed on the substrate 101. The first dielectric layer 102 may be any one selected from the group consisting of an oxide layer, a nitride layer and an oxynitride layer. The trenches 103, in which the buried bit lines 104 and the first source/drain layer 105 are filled, may have the same shapes as first trenches according to a second embodiment of the present invention which will be described later.

The buried bit lines 104, having shapes of partially filling the trenches 103, may include a low resistance substance, for example, a metallic layer to improve a signal transfer characteristic. The metallic layer includes a metal layer, a metal oxide layer, a metal nitride layer or a metal silicide layer.

The first source/drain layer 105, which fills the remaining portions of the trenches 103 on the buried bit lines 104, may include a semiconductor layer which is doped with impurities and has a monocrystalline state or a polycrystalline state. The semiconductor layer may be a silicon-containing layer, and the silicon-containing layer may be any one selected from the group consisting of a silicon (Si) layer, a silicon germanium (SiGe) layer and a silicon carbon (SiC) layer.

While not shown in the drawings, a conductive diffusion barrier for preventing diffusion of impurities or an ohmic contact layer for reducing contact resistance may be interposed between the buried bit lines 104 including the metallic layer and the first source/drain layer 105 including the semiconductor layer. Of course, a stack layer in which the conductive diffusion barrier and the ohmic contact layer are stacked may be interposed therebetween.

The first source/drain layer 105 may have a layout structure of a matrix in correspondence to the stack patterns 109. That is to say, the first source/drain layer 105 may have discontinuous portions disposed on the intersections of lines of the A-A' direction and the B-B' direction, which are isolated from one another in the A-A' direction by the first dielectric layer 102 and in the B-B' direction by a second dielectric layer 106. The second dielectric layer 106 has such patterns as to fill the remaining trenches 103 between the portions of the first source/drain layer 105 in the B-B' direction on the buried bit lines 104. The second dielectric layer 106 may be any one selected from the group consisting of an oxide layer, a nitride layer and an oxynitride layer, and it may be the same substance as the first dielectric layer 102.

When performing a bonding process such that the first source/drain layer 105 and the stack patterns 109 contact with each other, in order to improve a bonding characteristic, the surface of the first source/drain layer 105 may be flush with the surface of the substrate 101. In other words, in the first embodiment of the present invention, the surface of the first source/drain layer 105 may be flush with the surfaces of the first and second dielectric layers 102 and 106.

The stack patterns 109, having the structure in which the channel layer 107 and the second source/dram layer 108 are stacked, is fabricated not on the substrate 101 which is formed with the buried bit lines 104 but on a separate sacrificial substrate, and the stack patterns 109 are bonded to the substrate 101 such that the channel layer 107 contacts with the first source/drain layer 105. Accordingly, the stack patterns 109 may completely overlap with the first source/drain layer 105, or only portions of the stack patterns 109 may overlap with the first source/drain layer 105. Namely, the channel layer 107 of the stack patterns 109 may completely contact with the first source/drain layer 105, or portions of the channel layer 107 of the stack patterns 109 may contact with the first source/drain layer 105.

The stack patterns 109 as pillar type patterns may have a layout structure of a matrix, and the first source/drain layer 105 may have the layout structure of a matrix which corresponds to the stack patterns 109. The first source/drain layer 105 and the stack patterns 109 serve as active pillars.

The channel layer 107 and the second source/drain layer 108 may include a semiconductor layer which is doped with impurities and has a monocrystalline state or a polycrystalline state. The semiconductor layer may be a silicon-containing layer, and the silicon-containing layer may be any one selected from the group consisting of a silicon (Si) layer, a silicon germanium (SiGe) layer and a silicon carbon (SiC) layer.

While the crystalline states of the first source/drain layer 105 and the second source/drain layer 108 do not substantially influence operation characteristics of the semiconductor device, the channel layer 107 may have a monocrystalline state rather than a polycrystalline state since it serves as actual movement paths of charges. In order to control the operation characteristics of the semiconductor device, the first source/drain layer 105, the channel layer 107 and the second source/drain layer 108 may be the same semiconductor layers or respectively different semiconductor layers. Also, the first source/drain layer 105 and the second source/drain layer 108 may be the same semiconductor layers, and the channel layer 107 may be a semiconductor layer which is different from the first source/drain layer 105 and the second source/drain layer 108. Further, the first source/drain layer 105 and the second source/drain layer 108 may have the same conductivity type, and the channel layer 107 may have a conductivity type that is complementary to the first source/drain layer 105 and the second source/drain layer 108. For instance, the first source/drain layer 105 and the second source/drain layer 108 may have the N conductivity type, and the channel layer 107 may have the P conductivity type.

The word lines 112, as line type patterns which extend in the direction crossing with the buried bit lines 104 (that is, in the A-A' direction), are disposed adjacent to the sidewalls of the channel layer 107. The word lines 112 may have shapes of surrounding the portions of the channel layer 107 as shown in the drawings or being adjacent to portions of the sidewalls of the channel layer 107, for example, the word lines 112 may include first conductive lines which contact with one sidewalls of the channel layer 107 and second conductive lines which contact with the other sidewalls of the channel layer 107.

The word lines 112 may include a metallic layer to improve a signal transfer characteristic. A gate dielectric layer 111 is interposed between the word lines 112 and the channel layer 107. The gate dielectric layer 111 may extend to the lower surfaces of the word lines 112. In detail, the gate dielectric layer 111 may have a shape which is formed along the surface of the structure including the stack patterns 109, and it may be interposed not only between the channel layer 107 and the word lines 112 but also between the first and second dielectric layers 102 and 106 and the word lines 112. This is to prevent the first source/drain layer 105 and the word lines 112 from short-circuiting even when the first source/drain layer 105 is exposed due to misalignment in a process for forming the stack patterns 109.

The semiconductor device in accordance with the first embodiment of the present invention may further include hard mask patterns 110 which are formed on the stack patterns 109, a third dielectric layer 113 which gap-fills the spaces between the stack patterns 109 including the hard mask patterns 110, storage nodes 115 which are formed on the hard mask patterns 110, storage node contact plugs 114 which connect the storage nodes 115 with the second source/drain layer 108 by penetrating the hard mask patterns 110, a dielectric layer 116 which is formed on the surface of the structure including the storage nodes 115, and a plate electrode 117 which is formed on the dielectric layer 116.

The hard mask patterns 110 function to provide spaces for preventing the word lines 112 and the storage nodes 115 from interfering with each other and serve as etch barriers in the process for forming the stack patterns 109. The third dielectric layer 113 serves to electrically isolate the stack patterns 109 from one another and the word lines 112 from one another. The hard mask patterns 110 and the third dielectric layer 113 may be any one selected from the group consisting of an oxide layer, a nitride layer and an oxynitride layer.

In the semiconductor device in accordance with the first embodiment of the present invention, constructed as mentioned above, since the buried bit lines 104 are formed by a metallic layer, low resistance buried bit lines 104 may be realized, and since the stack patterns 109 are bonded to the substrate 101 formed with the buried bit lines 104, the low resistance buried bit lines 104 may be easily formed.

Furthermore, as a vertical channel semiconductor device is realized by bonding the buried bit lines 104 and the stack patterns 109, the process of forming the semiconductor device may be simplified. As a consequence, the degree of integration may be easily improved, and the capacitance between adjacent buried bit lines 104 may be reduced.

FIGS. 2A to 2I and 3A to 3I are cross-sectional views illustrating the processes of an exemplary method for fabricating the semiconductor device in accordance with the first embodiment of the present invention. FIGS. 2A to 2I are cross-sectional views taken according to the line A-A' of FIG. 1A, and FIGS. 3A to 3I are cross-sectional views taken according to the line B-B' of FIG. 1A.

Figure 2A:
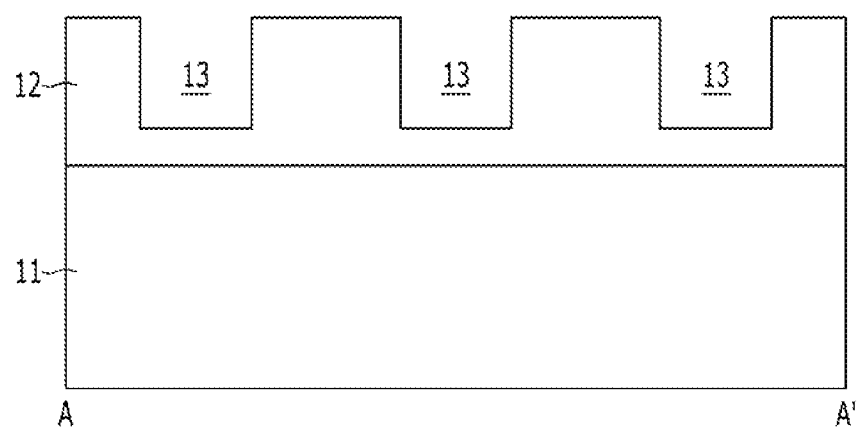
FIGS. 2A to 2I and 3A to 3I are cross-sectional views illustrating the processes of an exemplary method for fabricating the semiconductor device in accordance with the first embodiment of the present invention.
Figure 3A:
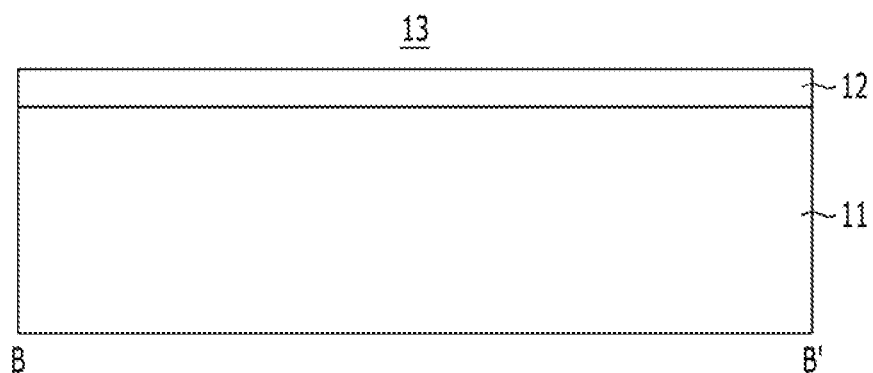

Referring to FIGS. 2A and 3A, a first dielectric layer 12 is formed on a substrate 11. The first dielectric layer 12 may be formed as any one selected from the group consisting of an oxide layer, a nitride layer and an oxynitride layer.

Next, after forming a photoresist pattern (not shown) on the first dielectric layer 12, a plurality of trenches 13 are defined by etching the first dielectric layer 12 using the photoresist pattern as an etch barrier. The trenches 13 are to provide spaces for forming buried bit lines and a first source/drain layer. Accordingly, the first dielectric layer 12 defined with the trenches 13 serve to electrically isolate adjacent buried bit lines from each other and the buried bit lines and the substrate 11 from each other. The trenches 13 may be defined as line type patterns which extend in the B-B' direction where the buried bit lines extend.

Figure 2B:
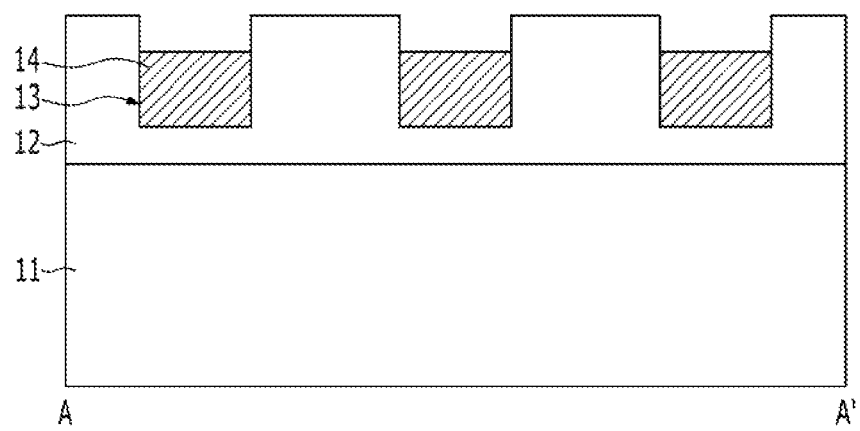
Figure 3B:
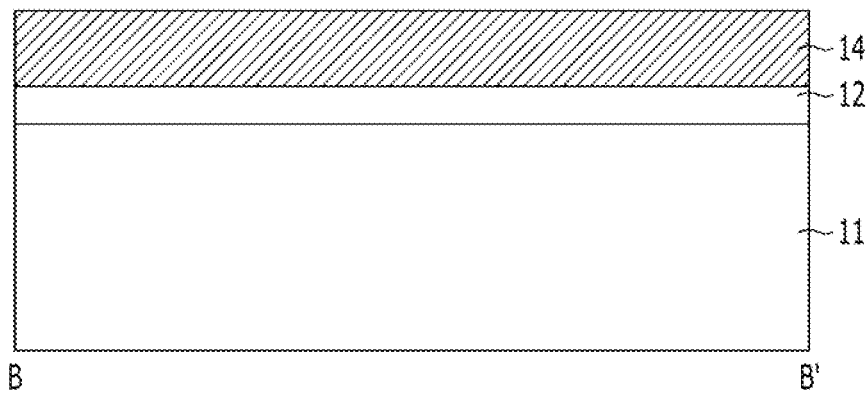

Referring to FIGS. 2B and 3B, buried bit lines 14 are formed to partially fill the trenches 13. The forming of the buried bit lines 14 to partially fill the trenches 13 is to provide spaces for subsequently forming the first source/drain layer.

The buried bit lines 14 are formed as a metallic layer so as to improve a signal transfer characteristic. In detail, the buried bit lines 14 may be formed as any one selected from the group consisting of a metal layer, a metal nitride layer, a metal oxide layer and a metal silicide layer or as a stack layer in which at least two of them are stacked.

The buried bit lines 14, which partially fill the trenches 13, may be formed through a series of processes of depositing a metallic layer on the entire surface of the substrate 11 to fill the trenches 13 and performing blanket etching, for example, etch-back, for the metallic layer. For example, in the case that the buried bit lines 14 are formed as a metal silicide layer, a series of processes of forming a silicon layer in the trenches 13 to partially fill the trenches 13, forming a metal layer on the entire surface of the substrate 11 including the silicon layer, performing annealing until the silicon layer and the metal layer fully react with each other to become a metal silicide layer, and removing the remaining metal layer.

Figure 2C:
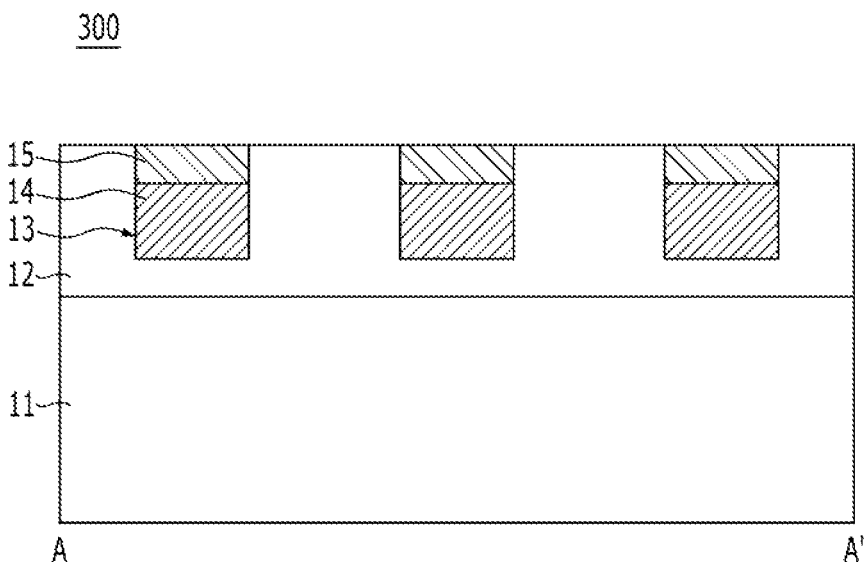
Figure 3C:
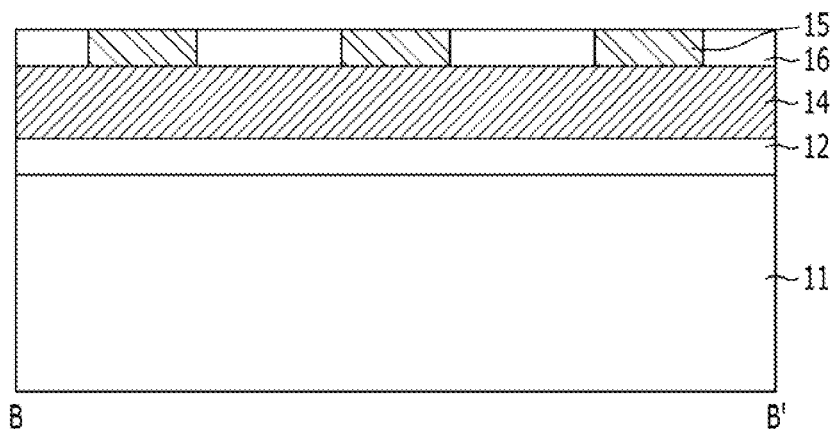

Referring to FIGS. 2C and 3C, a first source/drain layer 15 is formed on the buried bit lines 14 to fill the remaining portions of the trenches 13. The first source/drain layer 15 may be formed as a semiconductor layer which is doped with impurities and has a monocrystalline state or a polycrystalline state. The semiconductor layer may be a silicon-containing layer, and the silicon-containing layer may be any one selected from the group consisting of a silicon (Si) layer, a silicon germanium (SiGe) layer and a silicon carbon (SiC) layer. Because the first source/drain layer 15 serves as junction regions in transistors which are to be formed through subsequent processes, impurities may be implanted simultaneously when the first source/drain layer 15 is formed or subsequently after the first source/drain layer 15 is formed. For example, the first source/drain layer 15 may be doped with N-type impurities.

The first source/drain layer 15, which completely fills the trenches 13, may be formed through a series of processes of forming a semiconductor layer on the entire surface of the substrate 11 and performing a planarization process until the first dielectric layer 12 is exposed. The planarization process may be performed through chemical mechanical polishing (CMP).

Before forming the first source/drain layer 15, a conductive diffusion barrier (not shown) for preventing diffusion between the buried bit lines 14 and the first source/drain layer 15 or an ohmic contact layer (not shown) for reducing contact resistance between the buried bit lines 14 and the first source/drain layer 15 may be formed. Of course, a stack layer in which the conductive diffusion barrier and the ohmic contact layer are stacked may be interposed between the buried bit lines 14 and the first source/drain layer 15.

In succession, the first source/drain layer 15 is selectively etched to correspond to stack patterns which are to be formed through subsequent processes. The first source/drain layer 15 etched to correspond to the stack patterns has a layout structure of a matrix on the buried bit lines 14. That is to say, after the first source/drain layer 15 is etched to correspond to the stack patterns, the first source/drain layer 15 has discontinuous portions arranged in the direction where the buried bit lines 14 extend.

Then, a second dielectric layer 16 is formed on the buried bit lines 14 to fill the spaces between portions of the etched first source/drain layer 15. The second dielectric layer 16 functions to electrically isolate adjacent portions of the first source/drain layer 15 and protect the buried bit lines 14 during subsequent processes. Also, the second dielectric layer 16 functions to electrically isolate word lines to be formed through subsequent processes and the buried bit lines 14 from each other. The second dielectric layer 16 may be formed as any one selected from the group consisting of an oxide layer, a nitride layer and an oxynitride layer, and it may be formed of the same substance as the first dielectric layer 12.

Hereinafter, for the explanation purposes, a first structure including the first dielectric layer 12, the trenches 13, the buried bit lines 14, the first source/drain layer 15 and the second dielectric layer 16 on the substrate 11 will be referred to as a first wafer 300.

Figure 2D:
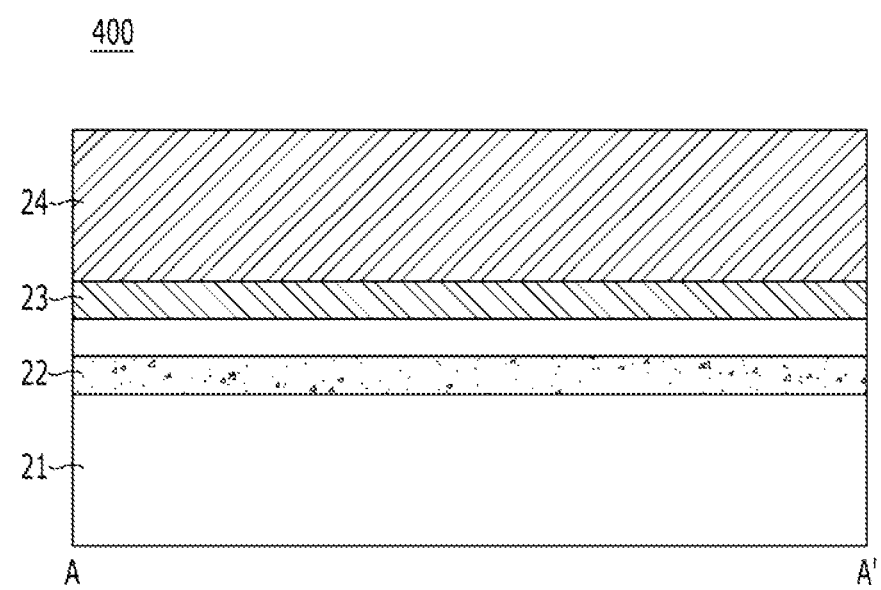
Figure 3D:
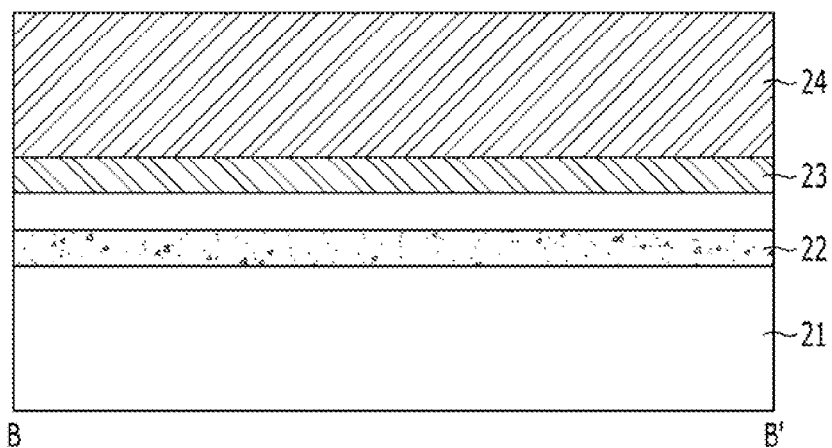

Referring to FIGS. 2D and 3D a second source/drain layer 23 and a channel layer 24 are sequentially formed on a sacrificial substrate 21 having a splitting layer 22 formed therein. The splitting layer 22 is to split two bonded wafers in a subsequent cleaving process. The splitting layer 22 may be formed by ion-implanting a volatile substance (for example, hydrogen) into the sacrificial substrate 21. For reference, the splitting layer 22 may be formed before or after the second source/drain layer 23 and the channel layer 24 are formed.

Each of the second source/drain layer 23 and the channel layer 24 may be formed as a semiconductor layer which is doped with impurities and has a monocrystalline state or a polycrystalline state. The semiconductor layer may be a silicon-containing layer, and the silicon-containing layer may be formed as any one selected from the group consisting of a silicon (Si) layer, a silicon germanium (SiGe) layer and a silicon carbon (SiC) layer.

In order to control the operation characteristics of transistors, the channel layer 24 and the first and second source/drain layers 15 and 23 may be formed of the same semiconductor substance or respectively different semiconductor substances. Also, the first and second source/drain layers 15 and 23 may be formed of the same semiconductor substance, and the channel layer 24 may be formed of a semiconductor substance which is different from the semiconductor substance of the first and second source/drain layers 15 and 23. Furthermore, since the channel layer 24 serves as channel regions in transistors which are to be formed through subsequent processes and the second source/drain layer 23 serves as junction regions of the transistors, the channel layer 24 and the second source/drain layer 23 may be doped with impurities simultaneously when or subsequently after they are formed. The first and second source/drain layers 15 and 23 may be doped with impurities to have the same conductivity type, and the channel layer 24 may be doped with impurities to have a conductivity type that is complementary to the first and second source/drain layers 15 and 23. For instance, the first and second source/drain layers 15 and 23 may be doped with N-type impurities, and the channel layer 24 may be doped with P-type impurities.

Hereinafter, for the illustrative purposes, a second structure including the channel layer 24 and the second source/drain layer 23 on the sacrificial substrate 21 formed with the splitting layer 22 will be referred to as a second wafer 400.

Figure 2E:
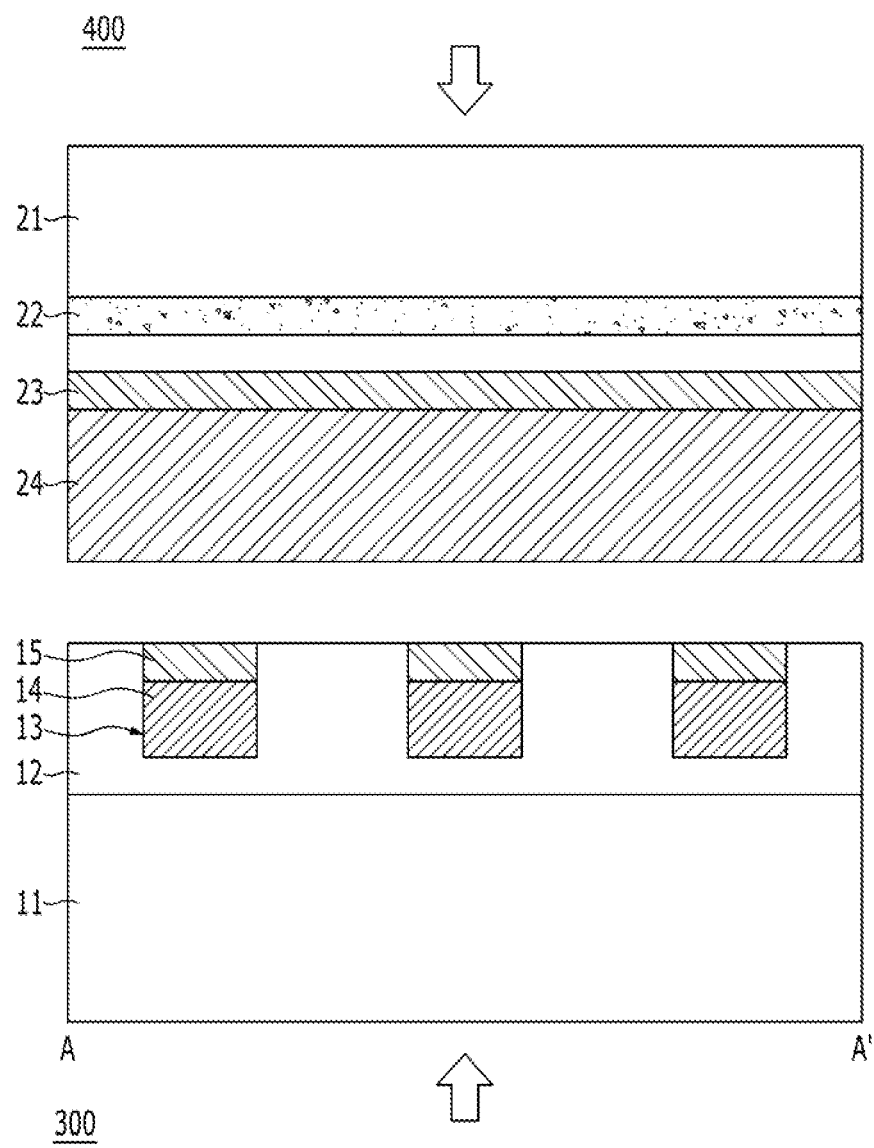
Figure 3E:
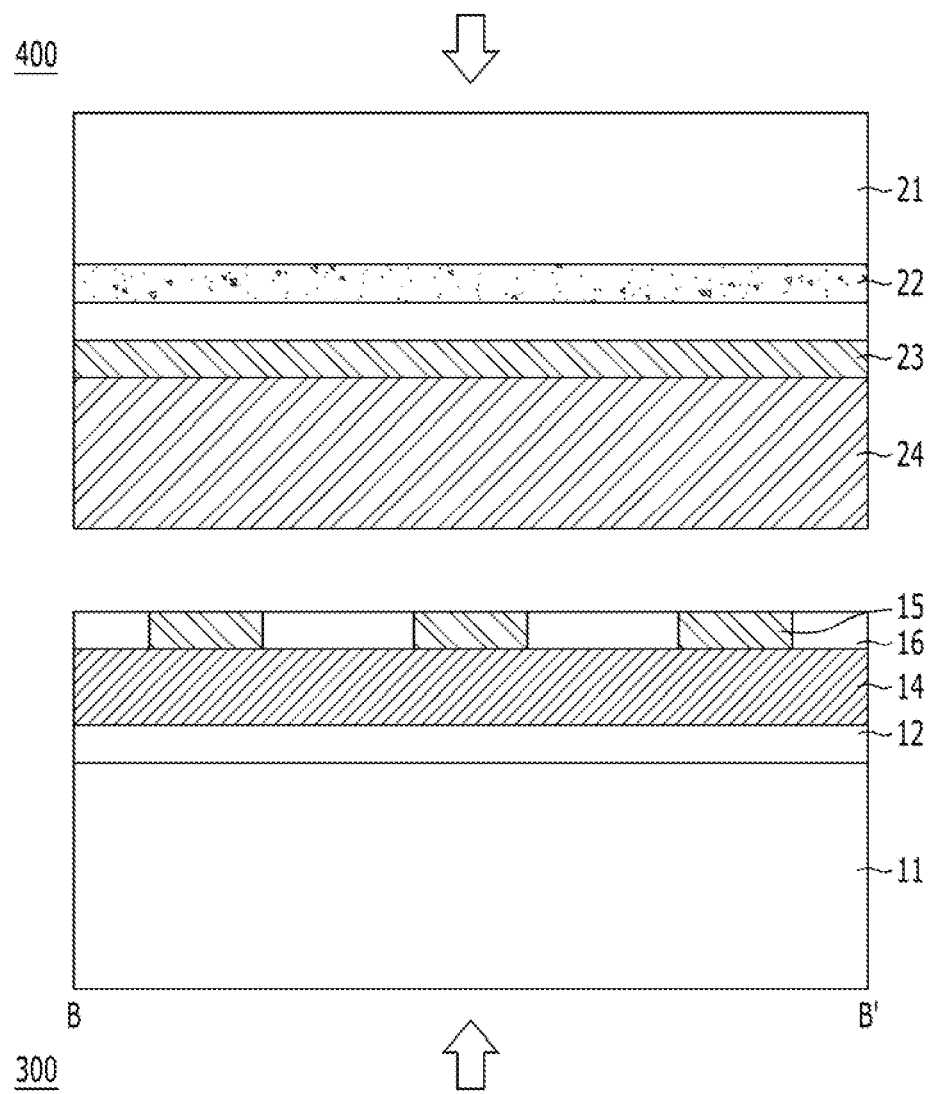

Referring to FIGS. 2E and 3E, after the surface of the first wafer 300, on which the first dielectric layer 12, the first source/drain layer 15 and the second dielectric layer 16 are exposed, and the surface of the second wafer 400, on which the channel layer 24 is exposed, are aligned to face each other, the first wafer 300 and the second wafer 400 are bonded with each other. Wafer bonding may be performed using various technologies generally known in the art. Before bonding the first and second wafers 300 and 400, given surface treatment may be performed so as to increase the adhesion force between them.

Meanwhile, the above-described structure may be formed by forming the buried bit lines 14 on the first wafer 300, forming a stack layer in which the channel layer 24 and the first and second source/drain layers 15 and 23 are stacked on the second wafer 400, and then bonding the first and second wafers 300 and 400. However, in this case, since the buried bit lines 14 to be placed under stack patterns are likely to be exposed due to misalignment in the subsequent process for forming the stack patterns, the characteristics of the semiconductor device may be degraded. In this regard, as in the embodiment of the present invention, in the case that the first and second wafers 300 and 400 are bonded with each other with the first source/drain layer 15 formed on the buried bit lines 14 and then the subsequent process for forming the stack patterns is performed, the buried bit lines 14 may be prevented from being exposed even when misalignment occurs and a process margin may be increased in the etching process for forming the stack patterns.

Figure 2F:
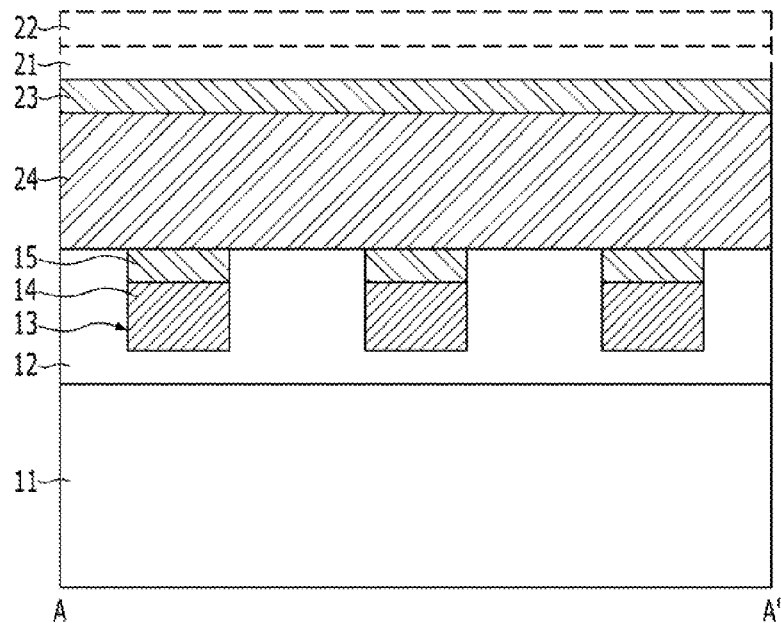
Figure 3F:
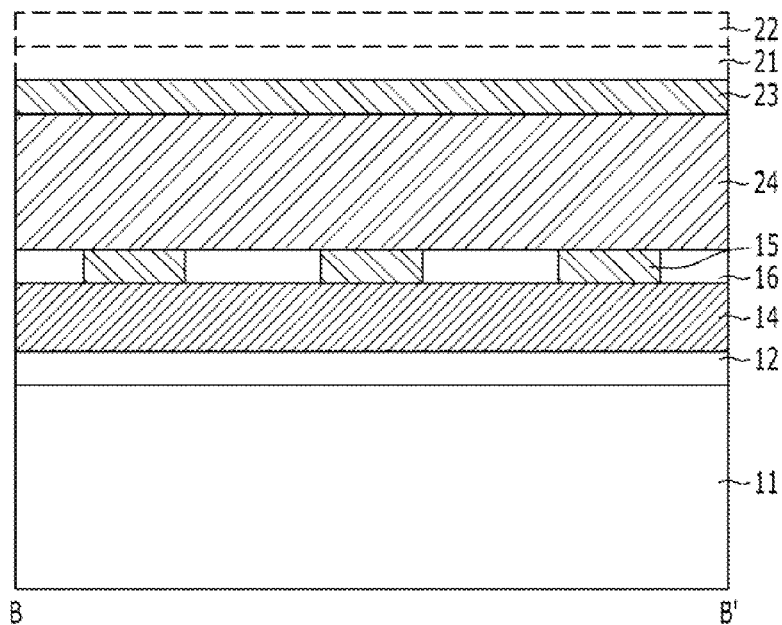

Referring to FIGS. 2F and 3F, a cleaving process of applying a physical shock to the splitting layer 22 and removing the sacrificial substrate 21 is performed. The cleaving process may be performed using various technologies well known in the art.

Next, residues remaining after the cleaving process are removed. For example, by performing a planarization process until the surface of the second source/drain layer 23 is exposed, the splitting layer 22 and the sacrificial substrate 21 remaining after the cleaving process are removed, and then a cleaning process may be performed.

Figure 2G:
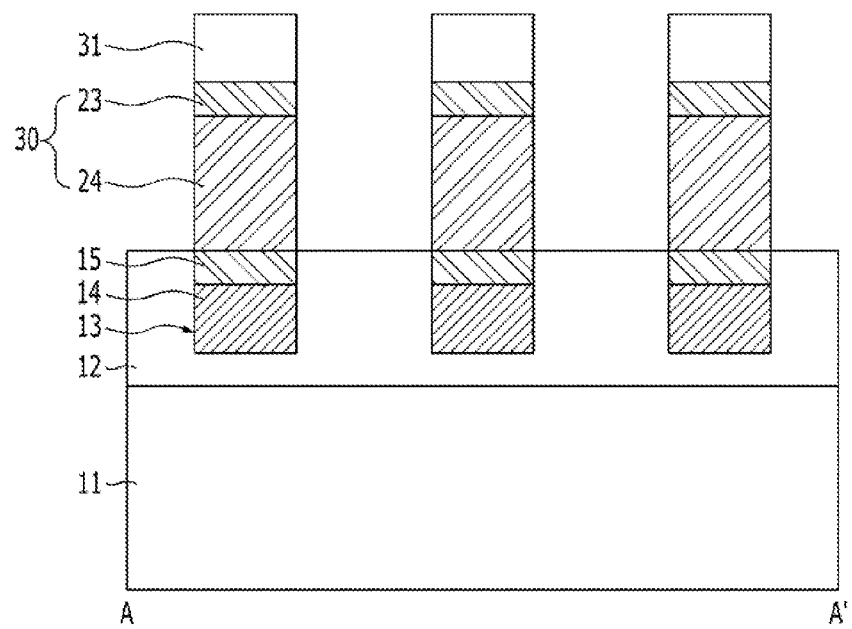
Figure 3G:
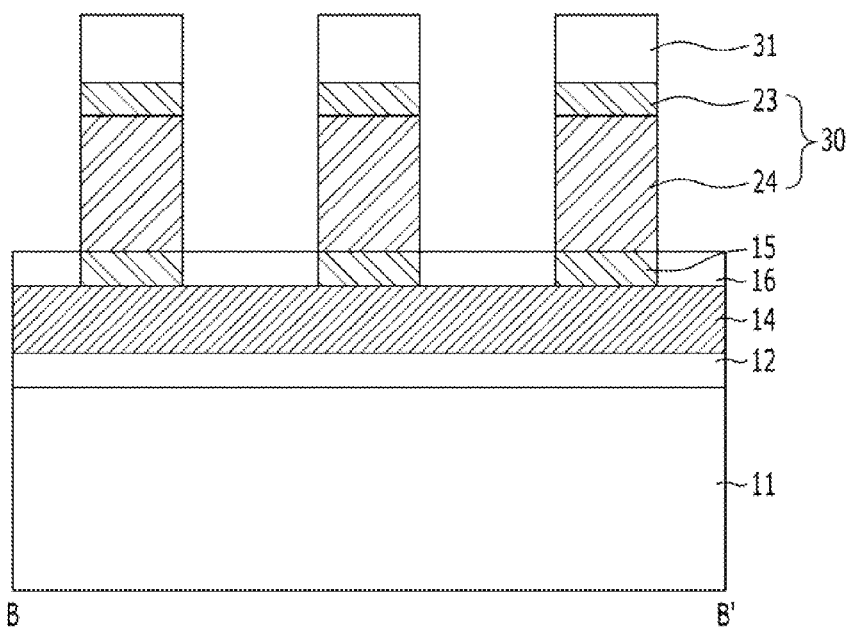

Referring to FIGS. 2G and 3G, after forming hard mask patterns 31 on the second source/drain layer 23, stack patterns 30 are formed by etching the second source/drain layer 23 and the channel layer 24 using the hard mask patterns 31 as etch barriers. When the etching process is completed, shapes in which the first source/drain layer 15, the channel layer 24, the second source/drain layer 23 and the hard mask patterns 31 are sequentially stacked are obtained.

The stack patterns 30 may be formed as pillar type patterns to have a layout structure of a matrix, by being separated from one another with a given gap therebetween in the A-A' direction and the B-B' direction. Furthermore, the stack patterns 30 may be formed such that the channel layer 24 completely or partially overlaps with the first source/drain layer 15.

Figure 2H:
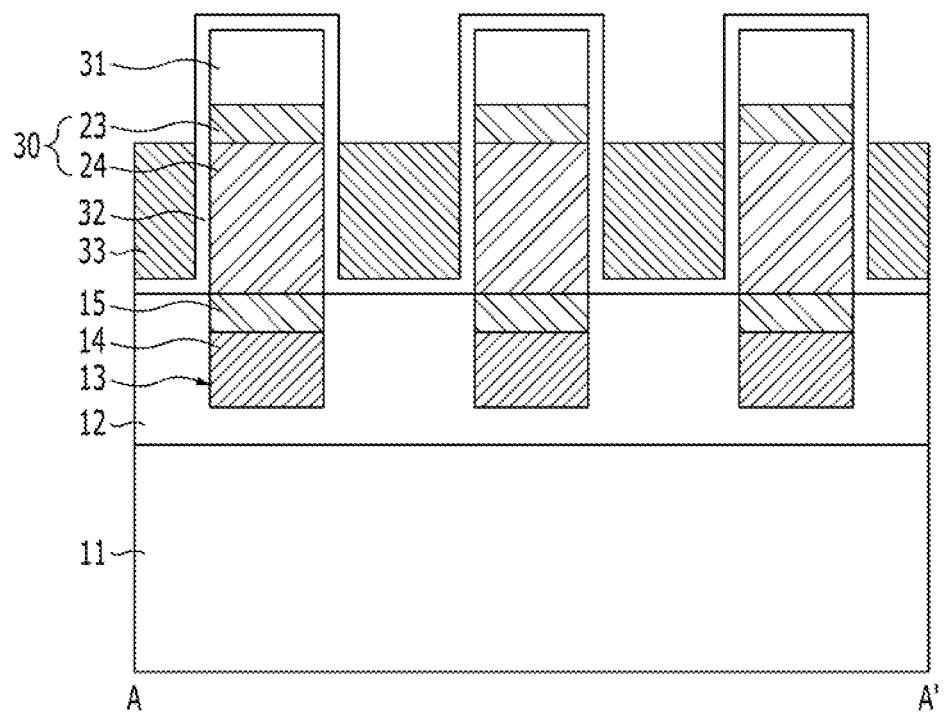
Figure 3H:
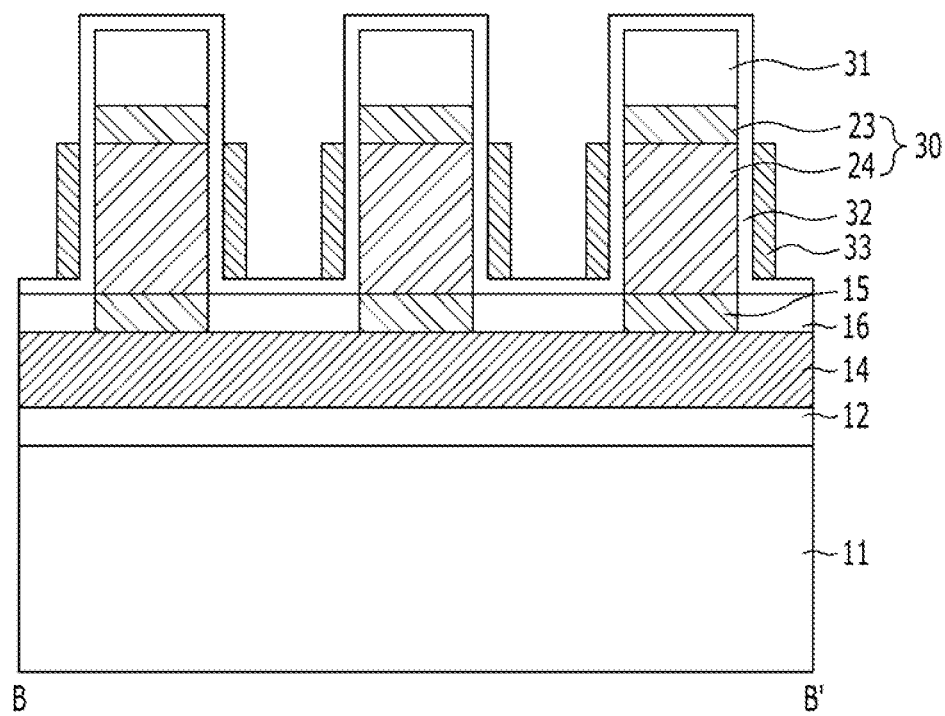

Referring to FIGS. 2H and 3H, a gate dielectric layer 32 is formed on the surface of the structure including the stack patterns 30. The forming of the gate dielectric layer 32 on the surface of the structure including the stack patterns 30 is to prevent the buried bit lines 14 and word lines to be formed through a subsequent process from short-circuiting due to loss of the second dielectric layer 16 during processes. Also, the forming of the gate dielectric layer 32 is to prevent the first source/drain layer 15 and the word lines from short-circuiting as the first source/drain layer 15 is exposed when misalignment occurs in the process of forming the stack patterns 30.

The gate dielectric layer 32 may be formed using oxidation (for example, thermal oxidation) or deposition (for example, chemical vapor deposition). The gate dielectric layer 32 may be formed such that a given thickness of the gate dielectric layer 32 is formed through oxidation and the thickness of the gate dielectric layer 32 increases through deposition on the sidewalls of the channel layer 24 and the second source/drain layer 23.

In succession, word lines 33 are formed on the first dielectric layer 12 and the second dielectric layer 16 to extend in the direction crossing with the buried bit lines 14 (that is, the A-A' direction) and contact with the stack patterns 30. The word lines 33 are formed adjacent to the sidewalls of the channel layer 24 of the stack patterns 30. The word lines 33 may be formed as a metallic layer. The word lines 33 may be formed to have shapes of being adjacent to one sidewall of the stack patterns 30 or surrounding the stack patterns 30. The word lines 33 may include first conductive lines which contact with one sidewall of the stack patterns 30 and second conductive lines which contact with the other sidewalls of the stack patterns 30. Because the gate dielectric layer 32 is interposed between the word lines 33 and the stack patterns 30, the word lines 33 serve as gate electrodes as well.

The word lines 33 may be formed through a series of processes of depositing a conductive layer on the entire surface of the substrate 11, controlling the height of the conductive layer by performing a recess process and patterning the conductive layer as line type patterns which extend in the direction crossing with the buried bit lines 14.

Figure 2I:
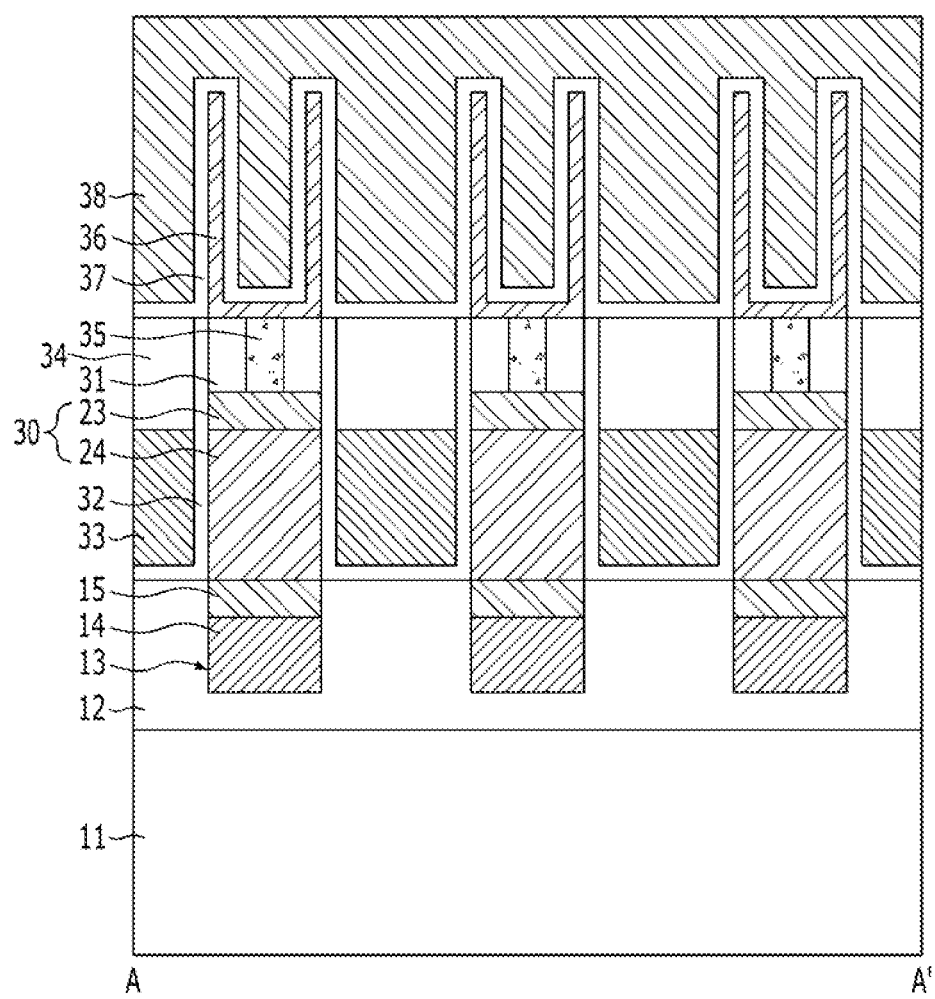
Figure 3I:
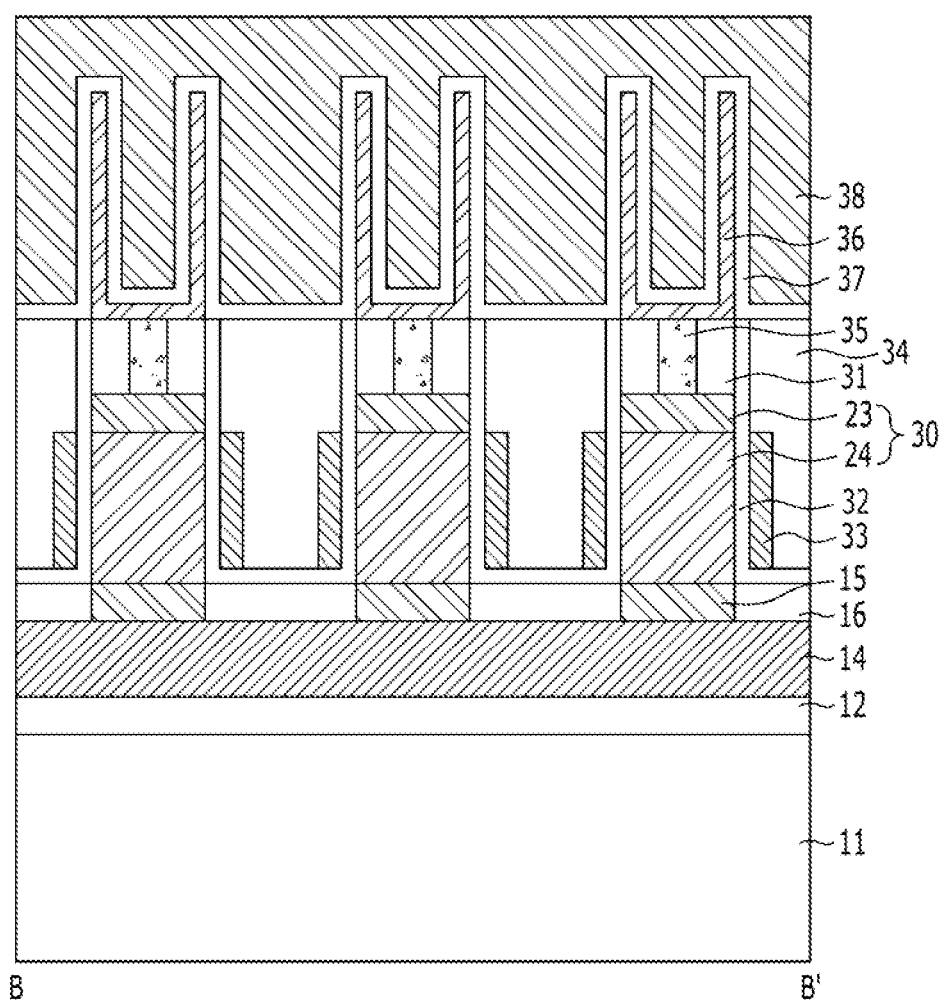

Referring to FIGS. 2I and 3I, after forming a third dielectric layer 34 to cover the entire surface of the resultant structure including the word lines 33, a planarization process is performed until the hard mask patterns 31 are exposed. The third dielectric layer 34 may be formed as any one selected from the group consisting of an oxide layer, a nitride layer and an oxynitride layer, and the planarization process may be performed through chemical mechanical polishing.

For reference, the planarization process may be performed until the second source/drain layer 23 is exposed. However, in this case, since a sufficient gap is not secured between storage nodes 36 to be formed through a subsequent process and the word lines 33, a margin of a process for forming the storage nodes 36 decreases, or operation characteristics of the semiconductor device are likely to be degraded due to interference between the storage nodes 36 and the word lines 33.

Next, by sequentially performing a process for forming storage node contact plugs 35 which are connected to the second source/drain layer 23 by penetrating the hard mask patterns 31, a process for forming the storage nodes 36, a process for forming a dielectric layer 37 and a process for forming a plate electrode 38, the vertical channel semiconductor device with the buried bit lines 14 is completed.

According to the method for fabricating the semiconductor device in accordance with the embodiment of the present invention, the buried bit lines 14 with low resistance may be realized by forming the buried bit lines 14 as a metallic layer, and the low resistance buried bit lines 14 may be easily formed by bonding the stack patterns 30 to the substrate 11 formed with the buried bit lines 14.

Also, by realizing the vertical channel semiconductor device through bonding the buried bit lines 14 and the stack patterns 30, respective structures thereof are simple, whereby it is easy to increase the degree of integration, processes may be simplified, processing difficulties may be lessened, and applicability for mass production may be improved. Furthermore, the capacitance between adjacent buried bit lines 14 may be reduced.

Figure 4A:
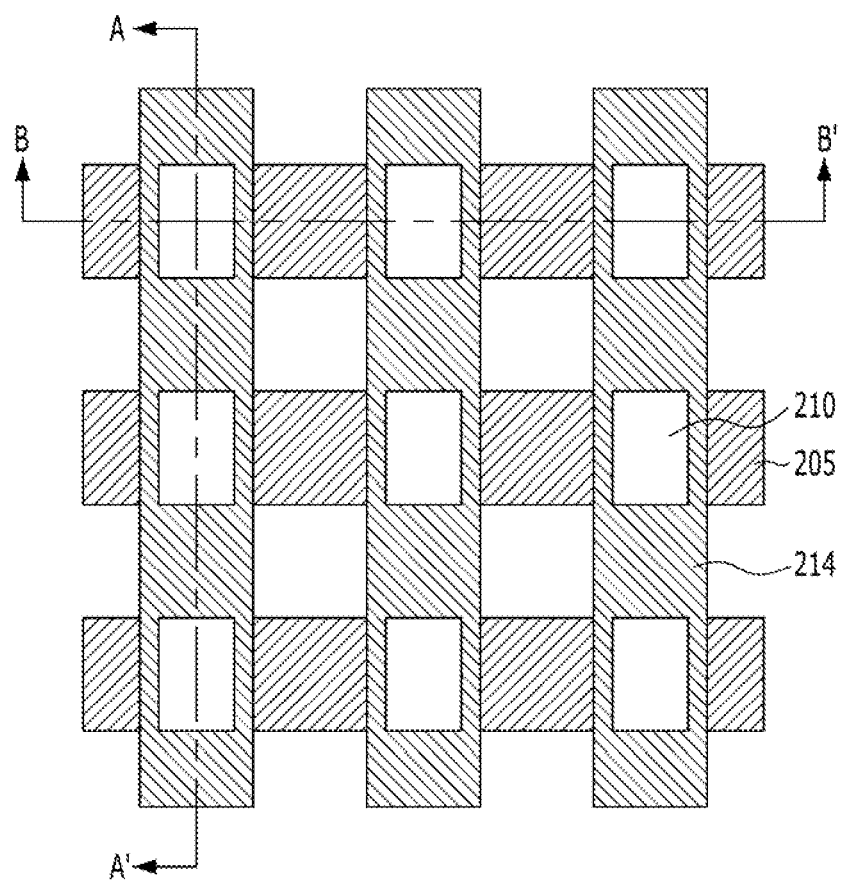
FIGS. 4A to 4C are views illustrating a semiconductor device in accordance with a second embodiment of the present invention.
Figure 4B:
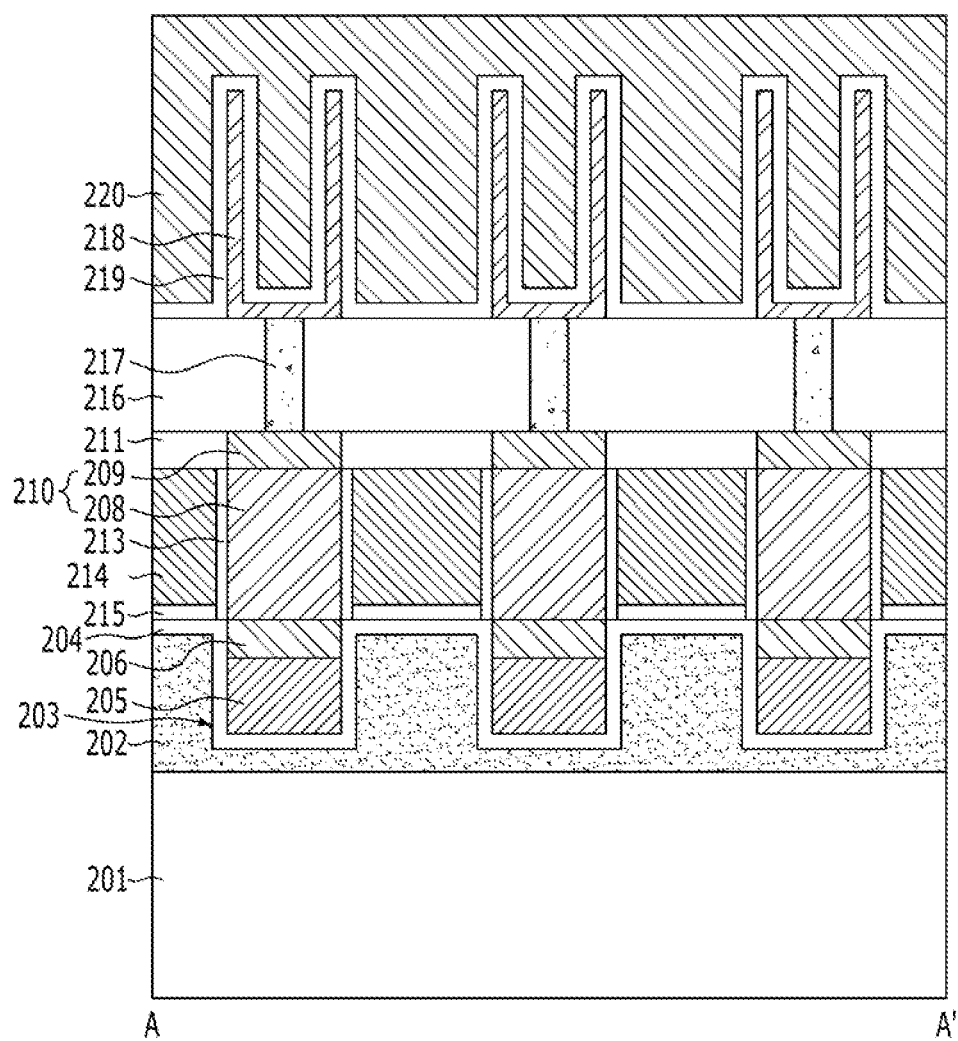
Figure 4C:
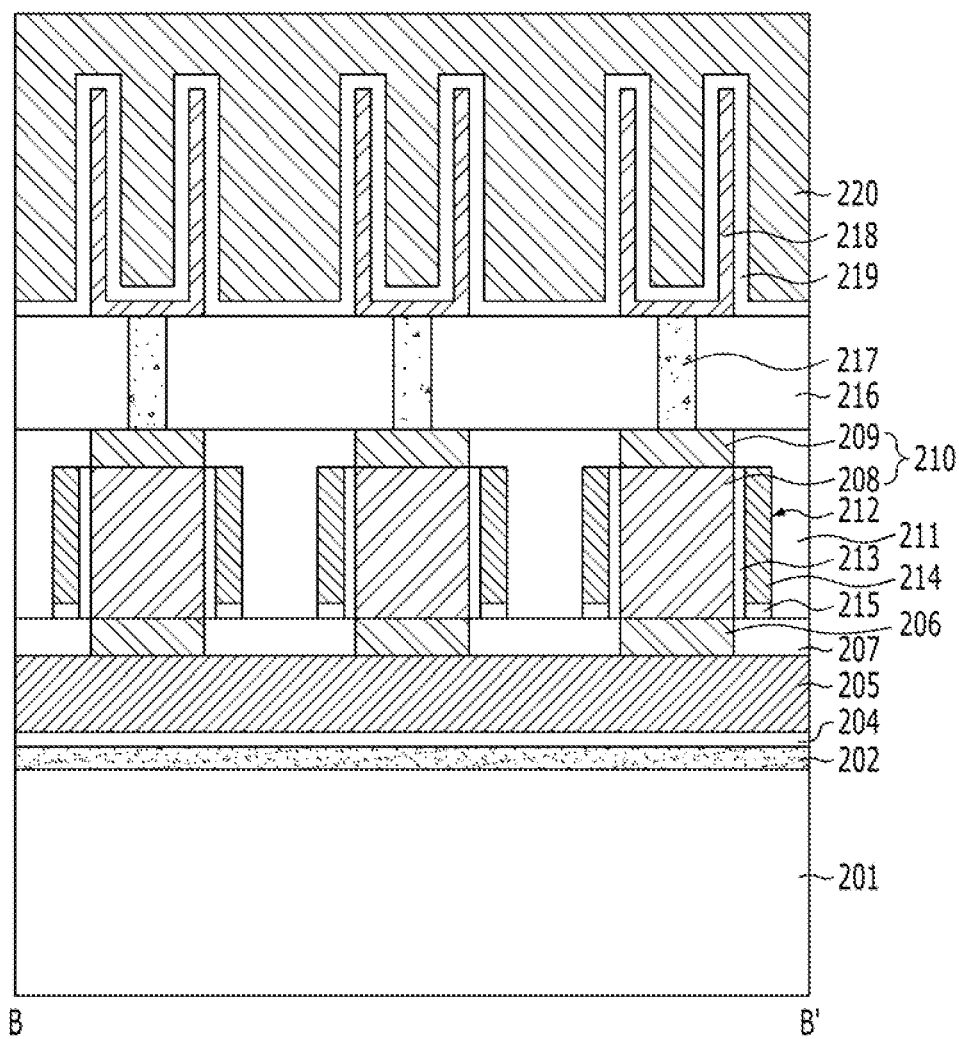

FIGS. 4A to 4C are views illustrating a semiconductor device in accordance with a second embodiment of the present invention. FIG. 4A is a plan view, FIG. 4B is a cross-sectional view taken along the line A-A' of FIG. 4A, and FIG. 4C is a cross-sectional view taken along the line B-B' of FIG. 4A.

Referring to FIGS. 4A to 4C, a semiconductor device in accordance with a second embodiment of the present invention includes a first structure having first trenches 203 which are defined in a substrate 201, buried bit lines 205 which partially fill the first trenches 203, and a first source/drain layer 206 which fills the remaining portions of the first trenches 203 on the buried bit lines 205. Also, the semiconductor device includes a second structure having stack patterns 210 in which a channel layer 208 and a second source/drain layer 209 are stacked, a third dielectric layer 211 which gap-fills the spaces between the stack patterns 210, second trenches 212 which are defined in the third dielectric layer 211 and expose the sidewalls of the channel layer 208, and word lines 214 which are filled in the second trenches 212. The semiconductor device in accordance with the second embodiment of the present invention may be characterized in that the first structure and the second structure are bonded with each other such that the buried bit lines 205 and the word lines 214 cross with each other and the first source/drain layer 206 and the channel layer 208 contact with each other.

The first trenches 203 are to provide spaces in which the buried bit lines 205 and the first source/drain layer 206 are formed, and they may be line type patterns which extend in the B-B' direction. In order to prevent the occurrence of punch-through between adjacent buried bit lines 205 and between the buried bit lines 205 and the substrate 201 the first trenches 203 may be defined in a punch-through preventing layer 202 which is formed on the substrate 201. The punch-through preventing layer 202 may be an impurity layer which is formed by ion-implanting impurities into the substrate 201. In order to electrically isolate adjacent buried bit lines 205 from each other and the buried bit lines 205 and the substrate 201 from each other, a first dielectric layer 204 may be formed on the surface of the substrate 201 including the first trenches 203. The first dielectric layer 204 may be any one selected from the group consisting of an oxide layer, a nitride layer and an oxynitride layer. The first trenches 203, in which the buried bit lines 205 and the first source/drain layer 206 are filled, may have the same shapes as the trenches according to the first embodiment of the present invention.

The buried bit lines 205, having the shapes of partially filling the first trenches 203, may include a low resistance substance, for example, a metallic layer, to improve a signal transfer characteristic. The metallic layer includes a metal layer, a metal oxide layer, a metal nitride layer or a metal suicide layer.

The first source/drain layer 206 which fills the remaining portions of the first trenches 203 on the buried bit lines 205 may include a semiconductor layer which is doped with impurities and has a monocrystalline state or a polycrystalline state. The semiconductor layer may be a silicon-containing layer, and the silicon-containing layer may be any one selected from the group consisting of a silicon (Si) layer, a silicon germanium (SiGe) layer and a silicon carbon (Sic) layer.

While not shown in the drawings, a conductive diffusion barrier for preventing diffusion of impurities or an ohmic contact layer for reducing contact resistance may be interposed between the buried bit lines 205 including the metallic layer and the first source/drain layer 206 including the semiconductor layer. Of course, a stack layer in which the conductive diffusion barrier and the ohmic contact layer are stacked may be interposed therebetween.

The first source/drain layer 206 may have a layout structure of a matrix in correspondence to the stack patterns 210. That is to say, the first source/drain layer 206 may have discontinuous portions disposed on the intersections of lines of the A-A' direction and the B-B' direction, which are isolated from one another by the first dielectric layer 204 in the A-A' direction and are isolated by a second dielectric layer 207 in the B-B' direction. The second dielectric layer 207 has such patterns as to fill the remaining first trenches 203 between the portions of the first source/drain layer 206 on the buried bit lines 205.

The second dielectric layer 207 may be any one selected from the group consisting of an oxide layer, a nitride layer and an oxynitride layer, and it may be the same substance as the first dielectric layer 204.

When performing a bonding process such that the first source/drain layer 206 and the stack patterns 210 contact with each other, in order to improve a bonding characteristic, the surface of the first source/drain layer 206 may be flush with the surface of the substrate 201. In other words, in the second embodiment of the present invention, the surface of the first source/drain layer 206 may be flush with the surfaces of the first and second dielectric layers 204 and 207.

The stack patterns 210, having the structure in which the channel layer 208 and the second source/drain layer 209 are stacked, is fabricated not on the substrate 201 which is formed with the buried bit lines 205 but on a separate sacrificial substrate, and the stack patterns 210 are bonded to the substrate 201 such that the channel layer 208 contacts with the first source/drain layer 206. Accordingly, the stack patterns 210 may completely overlap with the first source/drain layer 206, or only portions of the stack patterns 210 may overlap with the first source/drain layer 206. Namely, the channel layer 208 of the stack patterns 210 may completely contact with the first source/drain layer 206, or portions of the channel layer 208 of the stack patterns 210 may contact with the first source/drain layer 206.

The stack patterns 210 as pillar type patterns may have a layout structure of a matrix, and the first source/drain layer 206 may have the layout structure of a matrix which corresponds to the stack patterns 210. The first source/drain layer 206 and the stack patterns 210 serve as active pillars.

Each of the channel layer 208 and the second source/drain layer 209 may include a semiconductor layer which is doped with Impurities and has a monocrystalline state or a polycrystalline state. The semiconductor layer may be a silicon-containing layer, and the silicon-containing layer may be any one selected from the group consisting of a silicon (Si) layer, a silicon germanium (SiGe) layer and a silicon carbon (SiC) layer.

In order to contra the operation characteristics of the semiconductor device, the first source/drain layer 206, the channel layer 208 and the second source/drain layer 209 may be the same semiconductor layers or respectively different semiconductor layers. Also, the first source/drain layer 206 and the second source/drain layer 209 may be the same semiconductor layers, and the channel layer 208 may be a semiconductor layer which is different from the first source/drain layer 206 and the second source/drain layer 209. Further, the first source/drain layer 206 and the second source/drain layer 209 may have the same conductivity type, and the channel layer 208 may have a conductivity type that is complementary to the first source/drain layer 206 and the second source/drain layer 209. For instance, the first source/drain layer 206 and the second source/drain layer 209 may have the N conductivity type, and the channel layer 208 may have the P conductivity type.

The word lines 214 may have shapes which are filled in the second trenches 212 defined in the third dielectric layer 211 which gap-fills the spaces between the stack patterns 210. The third dielectric layer 211, in which the word lines 214 are formed and the second trenches 212 are defined, is fabricated on the sacrificial substrate and is bonded to the substrate 201. The word lines 214 as line type patterns which extend in the direction crossing with the buried bit lines 205 (that is, in the A-A' direction), are disposed adjacent to the sidewalls of the channel layer 208. The word lines 214 may have shapes of surrounding the portions of the channel layer 208 as shown in the drawings or being adjacent to portions of the sidewalls of the channel layer 208, for example, the word lines 214 may include first conductive lines which contact with one sidewalls of the channel layer 208 and second conductive lines which contact with the other sidewalls of the channel layer 208. The third dielectric layer 211 may be any one selected from the group consisting of an oxide layer, a nitride layer and an oxynitride layer.

The word lines 214 may have shapes which are partially filled in the second trenches 212, while a fourth dielectric layer 215 may fill the remaining portions of the second trenches 212 on the word lines 214. The fourth dielectric layer 215 performs a function of preventing the word lines 214 and the first source/drain layer 206 from short-circuiting, and it may be any one selected from the group consisting of an oxide layer, a nitride layer and an oxynitride layer.

The word lines 214 may include a metallic layer to improve a signal transfer characteristic. A gate dielectric layer 213 is interposed between the word lines 214 and the channel layer 208.

The semiconductor device in accordance with the second embodiment of the present invention may further include an interlayer dielectric layer 216 which is formed on the stack patterns 210, storage nodes 218 which are formed on the interlayer dielectric layer 216, storage node contact plugs 217 which connect the storage nodes 218 with the second source/drain layer 209 by penetrating the interlayer dielectric layer 216, a dielectric layer 219 which is formed on the surface of the structure including the storage nodes 218, and a plate electrode 220 which is formed on the dielectric layer 21g.

The interlayer dielectric layer 216 is to provide a space for preventing the word lines 214 and the storage nodes 218 from interfering with each other, and it may be any one selected from the group consisting of an oxide layer, a nitride layer and an oxynitride layer.

In the semiconductor device in accordance with the second embodiment of the present invention, constructed as mentioned above, since the buried bit lines 205 are formed by a metallic layer, the buried bit lines 205 with low resistance may be realized, and since the stack patterns 210 are bonded to the substrate 201 formed with the buried bit lines 205, the low resistance buried bit lines 205 may be easily formed.

Furthermore, as a vertical channel semiconductor device is realized by bonding the buried bit lines 205 and the stack patterns 210, the process of forming the semiconductor device may be simplified. As a consequence, the degree of integration may be easily improved, and the capacitance between adjacent buried bit lines 205 may be reduced.

FIGS. 5A to 5J and 6A to 6J are cross-sectional views illustrating the processes of an exemplary method for fabricating the semiconductor device in accordance with the second embodiment of the present invention. FIGS. 5A to 5J are cross-sectional views taken according to the line A-A' of FIG. 4A, and FIGS. 6A to 6J are cross-sectional views taken according to the line B-B' of FIG. 4A.

Figure 5A:
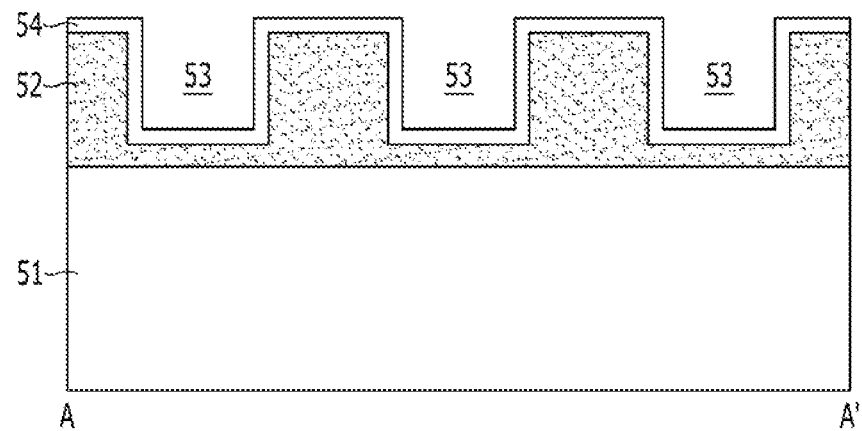
FIGS. 5A to 5J and 6A to 6J are cross-sectional views illustrating the processes of an exemplary method for fabricating the semiconductor device in accordance with the second embodiment of the present invention.
Figure 6A:
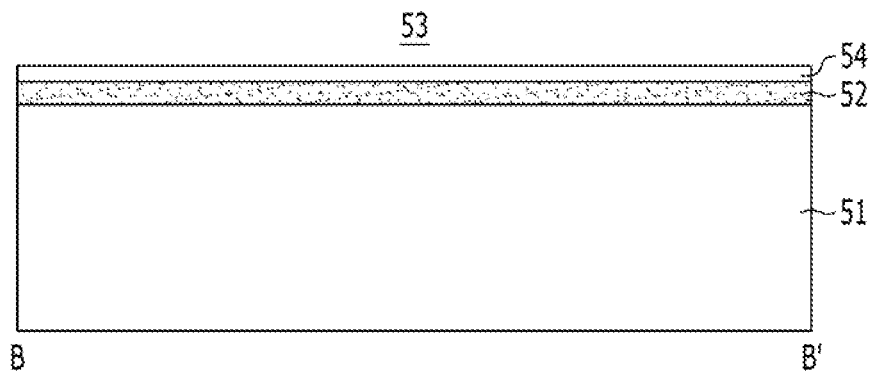

Referring to FIGS. 5A and 6A, a punch-through preventing layer 52 is formed by ion-implanting impurities into a substrate 51. The punch-through preventing layer 52 functions to prevent the occurrence of punch-through between buried bit lines to be formed through a subsequent process and between the buried bit lines and the substrate 51, and it may be formed by ion-implanting impurities into the substrate 51. At this time, the impurities may be P-type impurities.

Next, after forming a photoresist pattern (not shown) on the substrate 51, a plurality of first trenches 53 are defined by etching the substrate 51 using the photoresist pattern as an etch barrier. The first trenches 53 are to provide spaces for forming buried bit lines and a first source/drain layer in subsequent processes. The first trenches 53 may be defined as line type patterns which extend in one direction, for example, the direction (the B-B' direction) where the buried bit lines extend. Furthermore, in order to optimize the characteristics of the punch-through preventing layer 52, the depth of the first trenches 53 may be smaller than the depth of the punch-through preventing layer 52 from the surface of the substrate 51.

In succession, in order to electrically isolate adjacent buried bit lines from each other and the buried bit lines and the substrate 51 from each other in cooperation with the punch-through preventing layer 52, a first dielectric layer 54 is formed on the surface of the substrate 51 including the first trenches 53. The first dielectric layer 54 may be formed as any one selected from the group consisting of an oxide layer, a nitride layer and an oxynitride layer.

Figure 5B:
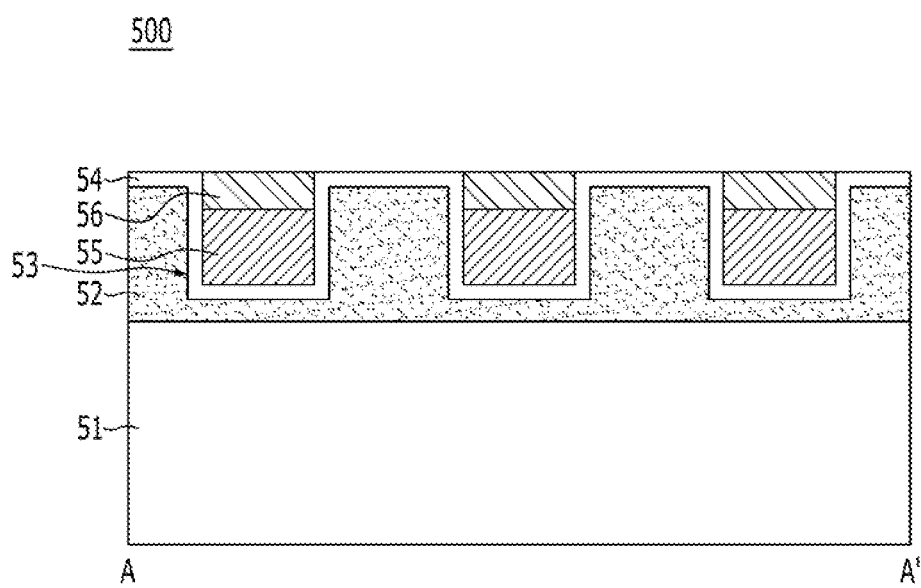
Figure 6B:
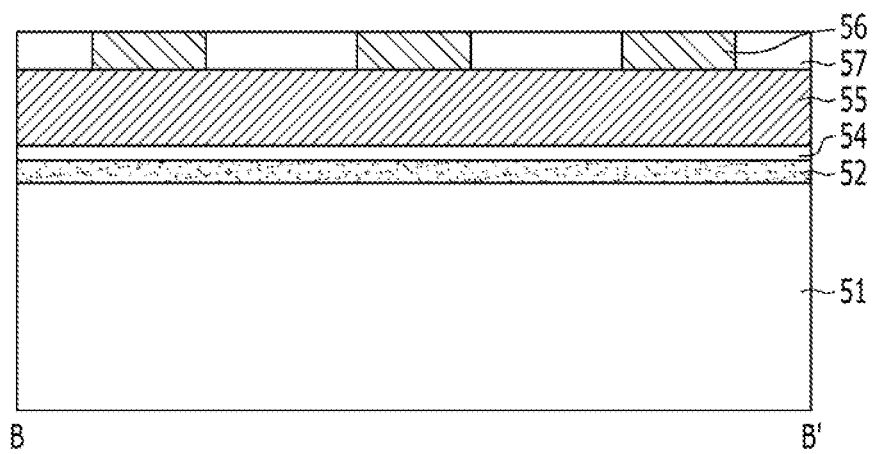

Referring to FIGS. 5B and 6B, buried bit lines 55 are formed to partially fill the first trenches 53. The buried bit lines 55 are formed as a metallic layer so as to improve a signal transfer characteristic. In detail, the buried bit lines 55 may be formed as any one selected from the group consisting of a metal layer, a metal nitride layer, a metal oxide layer and a metal silicide layer or as a stack layer in which at least two of them are stacked. The buried bit lines 55, which partially fill the first trenches 53 may be formed through a series of processes of depositing a metallic layer on the entire surface of the substrate 51 to fill the first trenches 53 and performing blanket etching, for example, etch-back, for the metallic layer.

Then, a first source/drain layer 56 is formed to fill the remaining portions of the first trenches 53 on the buried bit lines 55. The first source/drain layer 56 may be formed as a semiconductor layer which is doped with impurities and has a monocrystaltine state or a polycrystalline state. The semiconductor layer may be a silicon-containing layer, and the silicon-containing layer may be any one selected from the group consisting of a silicon (Si) layer, a silicon germanium (SiGe) layer and a silicon carbon (SiC) layer. Because the first source/drain layer 56 serves as junction regions in transistors which are to be formed through subsequent processes, impurities may be implanted into the first source/drain layer 56 simultaneously when the first source/drain layer 56 is formed or subsequently after the first source/drain layer 56 is formed. For example, the first source/drain layer 56 may be doped with N-type impurities.

The first source/drain layer 56, which completely fills the first trenches 53, may be formed through a series of processes of forming a semiconductor layer on the entire surface of the substrate 51 and performing a planarization process until the first dielectric layer 54 is exposed. The planarization process may be performed through chemical mechanical polishing (CMP).

Before forming the first source/drain layer 56, a conductive diffusion barrier (not shown) for preventing diffusion between the buried bit lines 55 and the first source/drain layer 56 or an ohmic contact layer (not shown) for reducing contact resistance between the buried bit lines 55 and the first source/drain layer 56 may be formed. Of course, a stack layer in which the conductive diffusion barrier and the ohmic contact layer are stacked may be interposed between the buried bit lines 55 and the first source/drain layer 56.

In succession, the first source/drain layer 56 is selectively etched to correspond to stack patterns which are to be formed through subsequent processes. The first source/drain layer 56 etched to correspond to the stack patterns has a layout structure of a matrix on the buried bit lines 55. That is to say, after the first source/drain layer 56 is etched to correspond to the stack patterns, the first source/drain layer 56 has discontinuous portions arranged in the direction where the buried bit lines 55 extend.

Next, a second dielectric layer 57 is formed on the buried bit lines 55 to fill the spaces between portions of the etched first source/drain layer 56. The second dielectric layer 57 functions to electrically isolate adjacent portions of the first source/drain layer 56 and protect the buried bit lines 55 during subsequent processes. Also, the second dielectric layer 57 functions to electrically isolate word lines to be formed through subsequent processes and the buried bit lines 55 from each other. The second dielectric layer 57 may be formed as any one selected from the group consisting of an oxide layer, a nitride layer and an oxynitride layer, and it may be formed of the same substance as the first dielectric layer 54.

Hereinafter, for the illustrative purposes, a first structure including the substrate 51, the punch-through preventing layer 52, the first trenches 53, the first dielectric layer 54, the buried bit lines 55, the first source/drain layer 56 and the second dielectric layer 57 will be referred to as a first wafer 500.

Figure 5C:
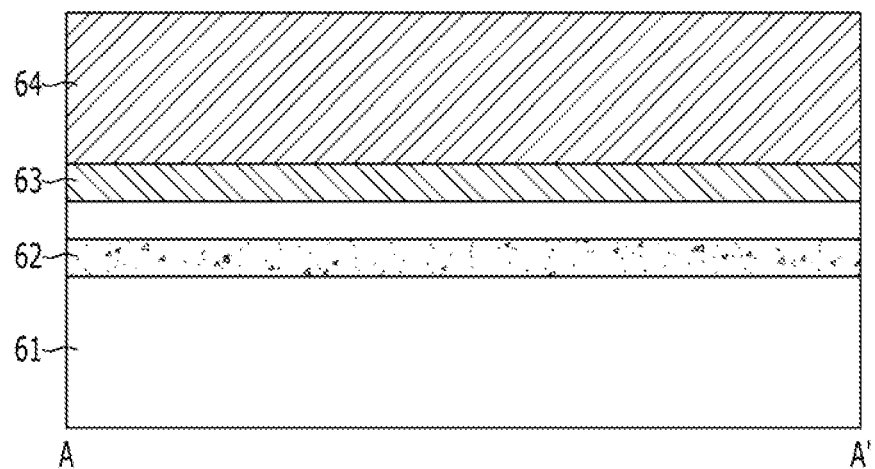
Figure 6C:
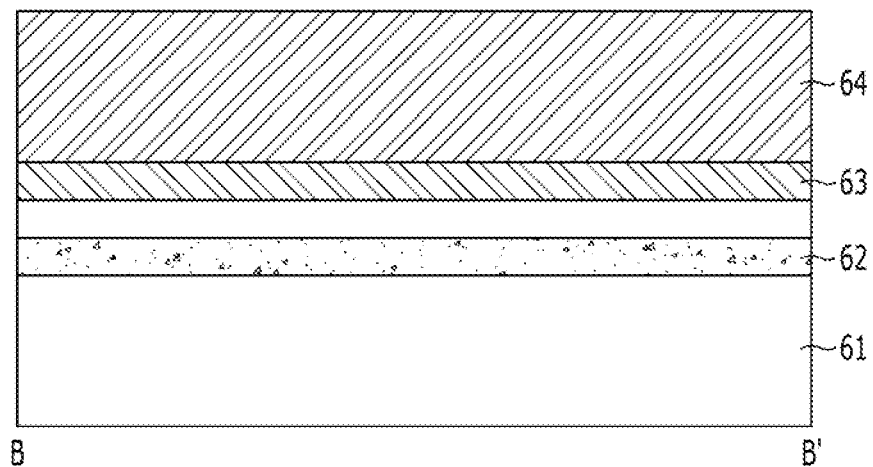

Referring to FIGS. 5C and 6C, a second source/drain layer 63 and a channel layer 64 are sequentially formed on a sacrificial substrate 61 having a splitting layer 62 formed therein. The splitting layer 62 is to split two bonded wafers in a subsequent cleaving process. The splitting layer 62 may be formed by ion-implanting a volatile substance (for example, hydrogen) into the sacrificial substrate 61. For reference, the splitting layer 62 may be formed before or after the second source/drain layer 63 and the channel layer 64 are formed.

Each of the second source/drain layer 63 and the channel layer 64 may be formed as a semiconductor layer which is doped with impurities and has a monocrystalline state or a polycrystalline state. The semiconductor layer may be a silicon-containing layer, and the silicon-containing layer may be formed as any one selected from the group consisting of a silicon (Si) layer, a silicon germanium (SiGe) layer and a silicon carbon (SiC) layer. In order to control the operation characteristics of transistors, the channel layer 64 and the first and second source/drain layers 56 and may be formed of the same semiconductor substance or respectively different semiconductor substances. Also, the first and second source/drain layers 56 and 63 may be formed of the same semiconductor substance, and the channel layer 64 may be formed of a semiconductor substance which is different from the semiconductor substance of the first and second source/drain layers 56 and 63.

Furthermore, since the channel layer 64 serves as channel regions in transistors which are to be formed through subsequent processes and the second source/drain layer 63 serves as junction regions of the transistors, the channel layer 64 and the second source/drain layer 63 may be doped with impurities simultaneously when or subsequently after they are formed. The first and second source/drain layers 56 and 63 may be doped with impurities to have the same conductivity type, and the channel layer 64 may be doped with impurities to have a conductivity type that is complementary to the first and second source/drain layers 56 and 63. For instance, the first and second source/drain layers 56 and 63 may be doped with N-type impurities, and the channel layer 64 may be doped with P-type impurities.

Figure 5D:
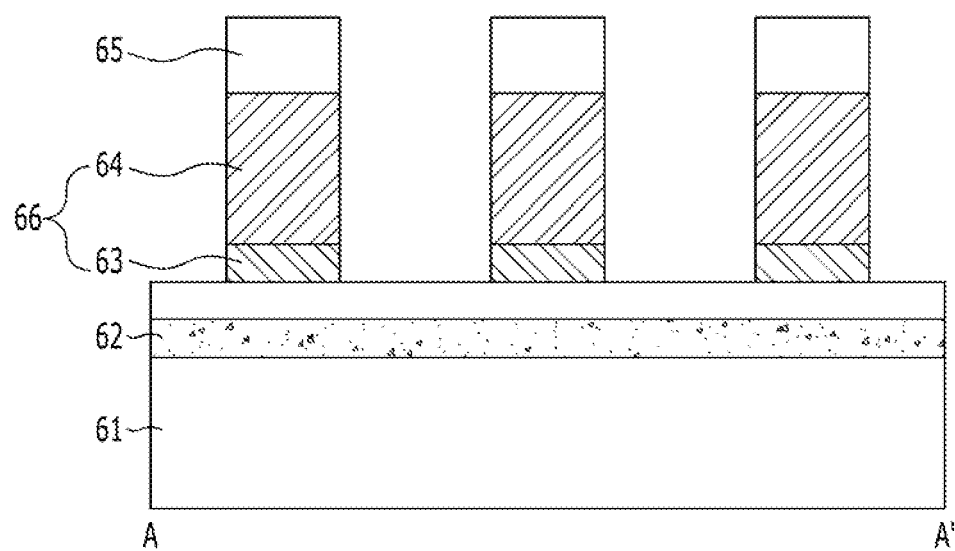
Figure 6D:
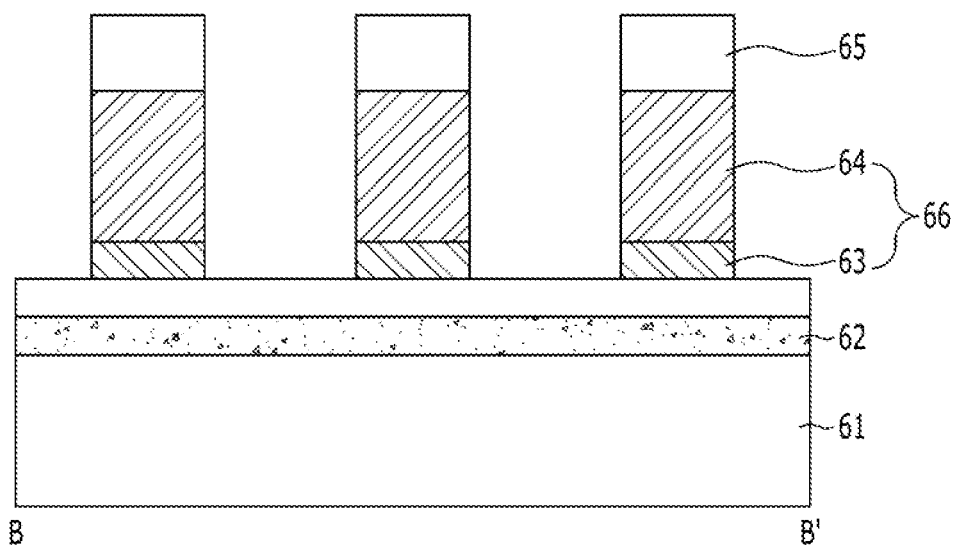

Referring to FIGS. 5D and 6D, after forming first hard mask patterns 65 on the channel layer 64, stack patterns 66 are formed by sequentially etching the channel layer 64 and the second source/drain layer 63 using the first hard mask patterns 65 as etch barriers. The stack patterns 66 may be formed as pillar type patterns to have a layout structure of a matrix in which the stack patterns 66 are separated from one another with a given gap therebetween.

Figure 5E:
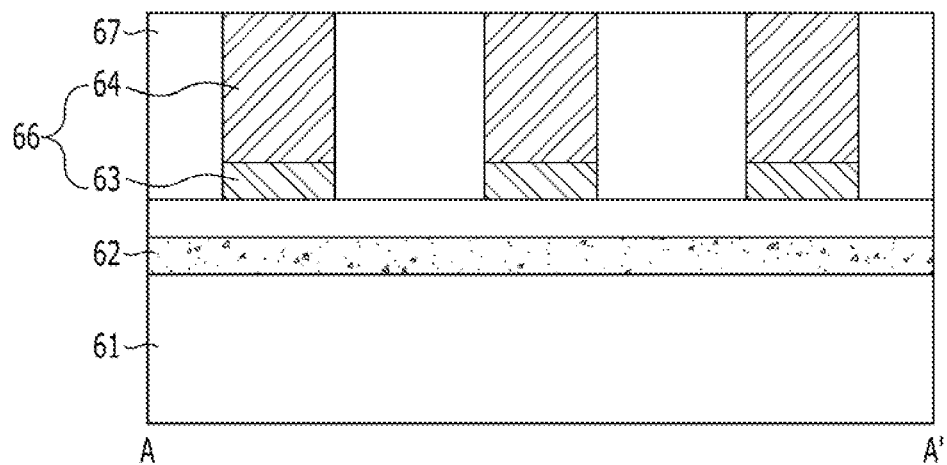
Figure 6E:
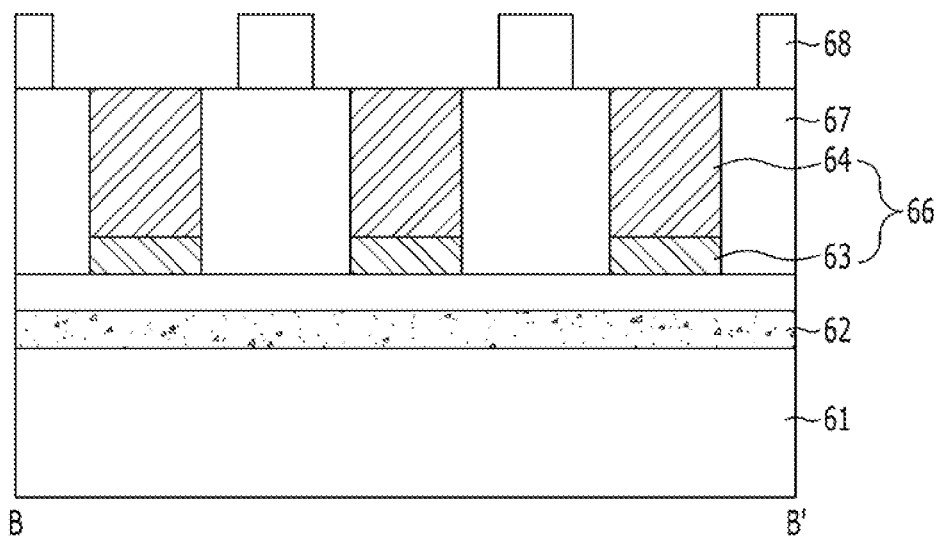

Referring to FIGS. 5E and 6E, after removing the first hard mask patterns 65, a third dielectric layer 67 is formed to gap-fill the spaces between the stack patterns 66. The third dielectric layer 67 may be formed through a series of processes of forming the third dielectric layer 67 on the entire surface of the sacrificial substrate 61 including the stack patterns 66 and then performing a planarization process until the channel layer 64 is exposed. The third dielectric layer 67 may be formed as any one selected from the group consisting of an oxide layer, a nitride layer and an oxynitride layer, and the planarization process may be performed through chemical mechanical polishing. Meanwhile, the first hard mask patterns 65 may be removed in the planarization process.

Next, second hard mask patterns 68 are formed on the third dielectric layer 67. The second hard mask patterns 68 are to form word lines and may be formed as line type patterns which extend in a direction crossing with the direction where the buried bit lines 55 extend.

Figure 5F:
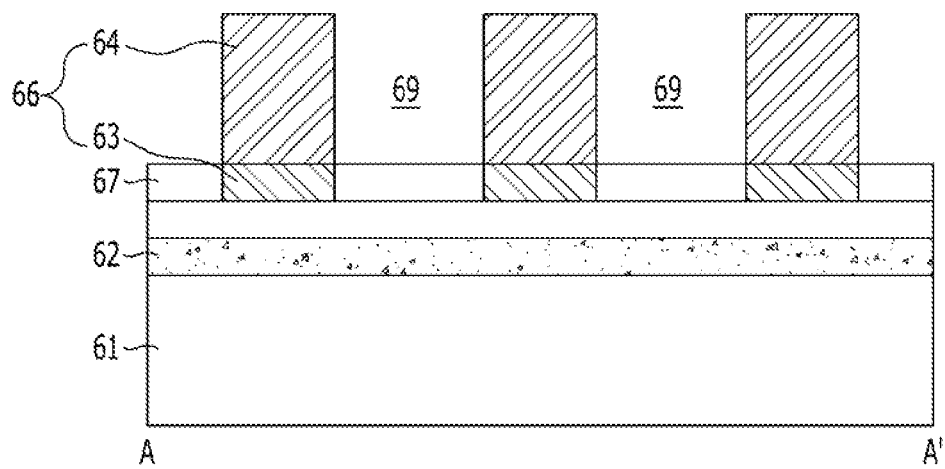
Figure 6F:
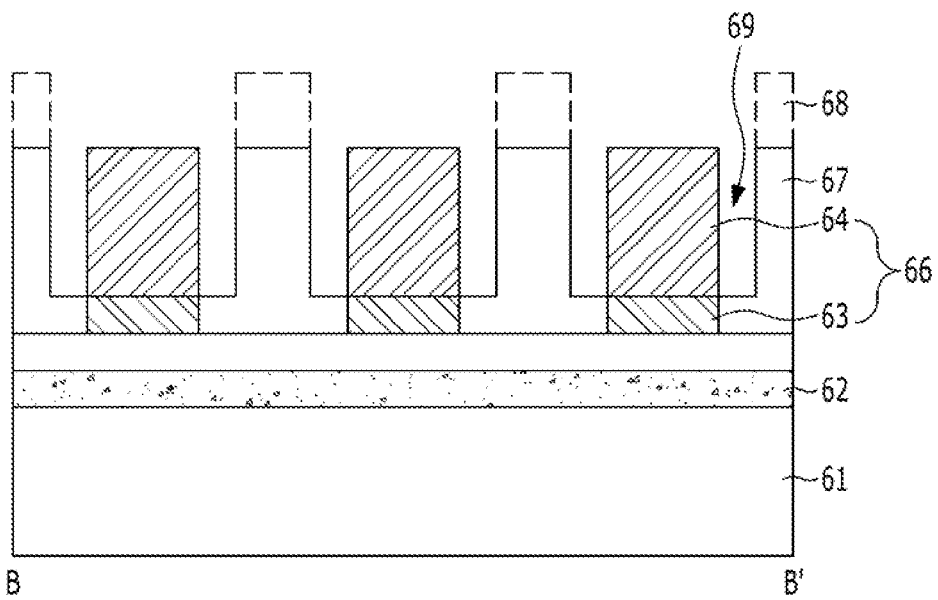

Referring to FIGS. 5F and 6F, by recess-etching the third dielectric layer 37 using the second hard mask patterns 68 as etch barriers, second trenches 69 are defined to expose the sidewalls of the channel layer 64 of the stack patterns 66. The second trenches 69 may be line type patterns depending on the shapes of the second hard mask patterns 68 and may be defined to have a structure of exposing one or all sidewalls of the channel layer 64.

Then, the second hard mask patterns 68 are removed.

Figure 5G:
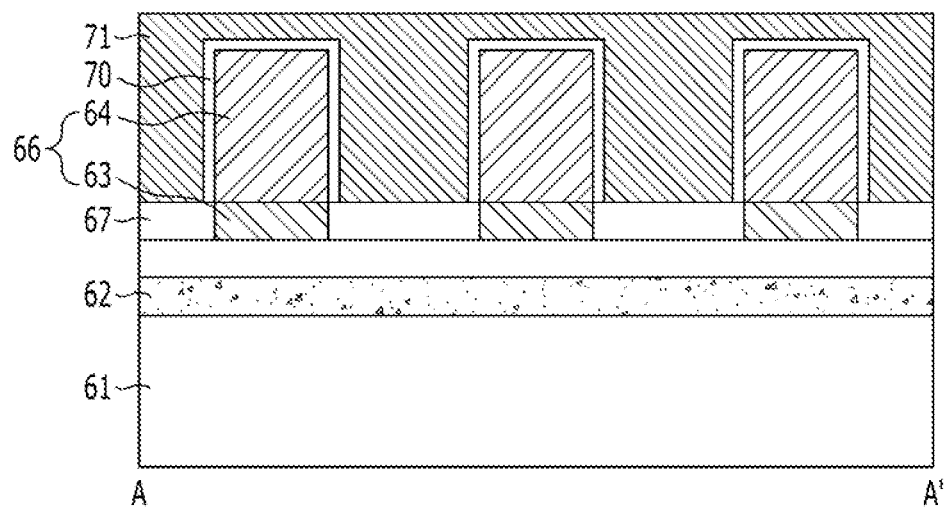
Figure 6G:
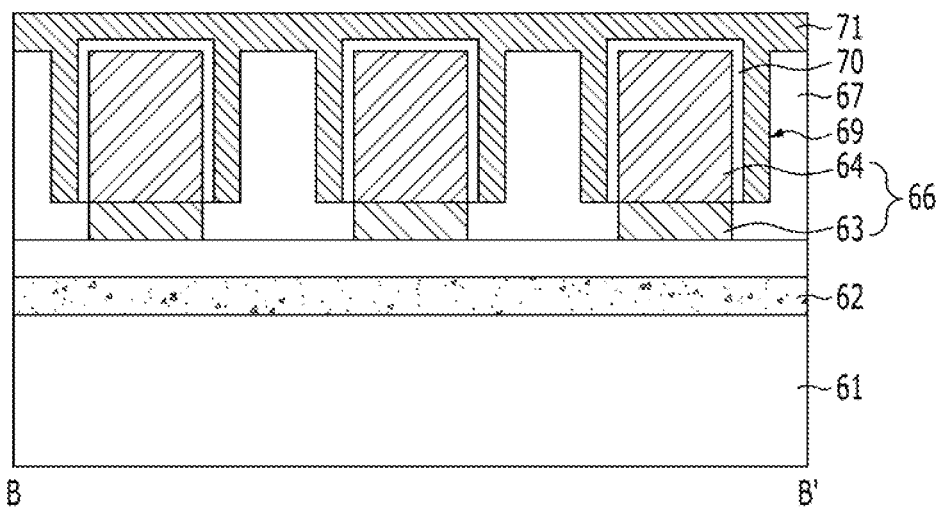

Referring to FIGS. 5G and 6G, a gate dielectric layer 70 is formed on the surface of the channel layer 64 which is exposed by defining of the second trenches 69. The gate dielectric layer 70 may be formed using oxidation (for example, thermal oxidation) or deposition (for example, chemical vapor deposition). The gate dielectric layer 70 may be formed such that a given thickness of the gate dielectric layer 70 is formed through oxidation and the thickness of the gate dielectric layer 70 increases through deposition.

In succession, a conductive layer 71 is formed on the entire surface of the sacrificial substrate 61 to fill the second trenches 69. The conductive layer 71 may be formed as a metallic layer. In detail, the conductive layer 71 may be formed as any one selected from the group consisting of a metal layer, a metal nitride layer, a metal oxide layer and a metal silicide layer or as a stack layer in which at least two of them are stacked.

Figure 5H:
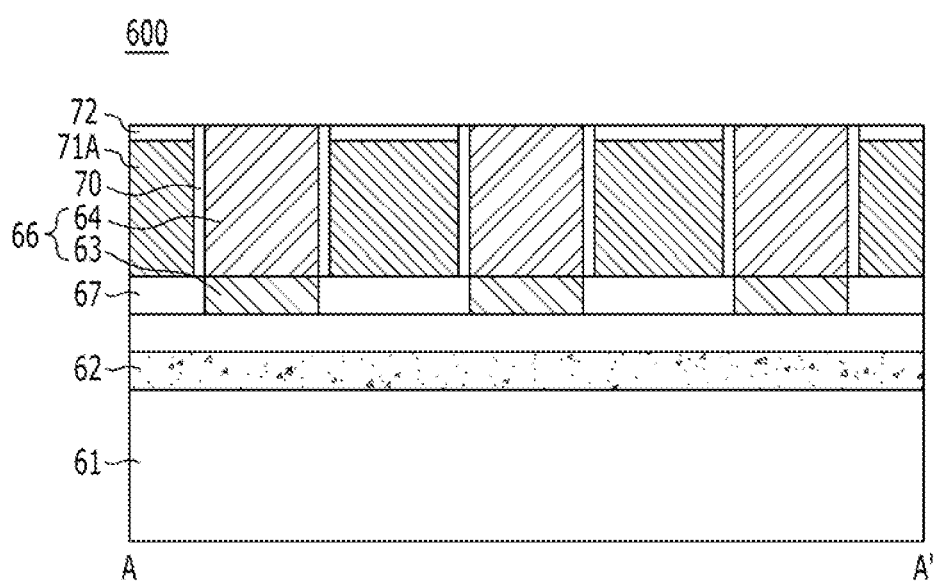
Figure 6H:
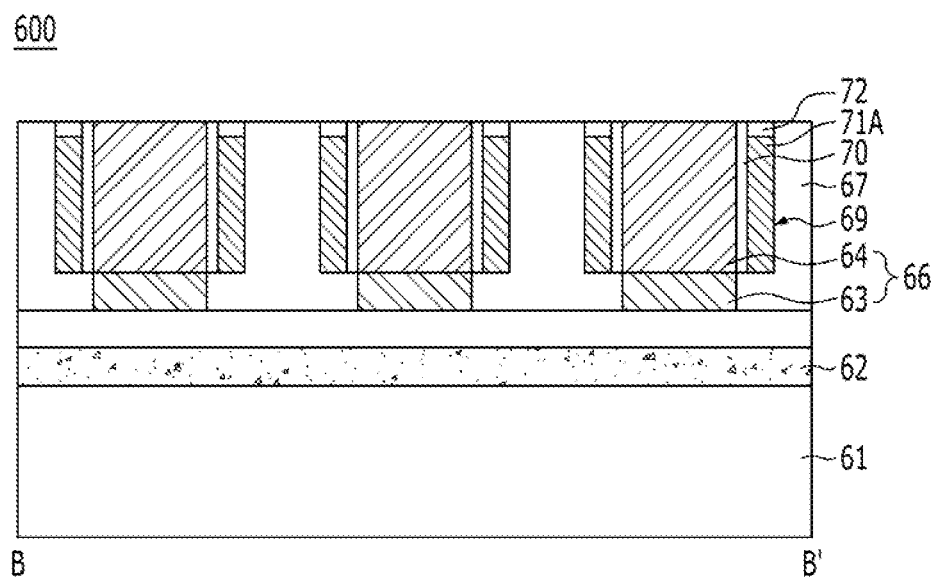

Referring to FIGS. 5H and 6H, by selectively etching the conductive layer 71, word lines 71A are formed to partially fill the second trenches 69. That is to say, the conductive layer 71 is etched such that the surfaces of the word lines 71A are lower than the surface of the channel layer 64 at a time when the process for forming the word lines 71A is completed. The etching process may be performed through blanket etching, for example, etch-back.

Then, after forming a fourth dielectric layer 72 on the entire surface of the resultant structure including the word lines 71A, a planarization process is performed until the channel layer 64 is exposed. The fourth dielectric layer 72 performs a function of preventing the word lines 72 and the first source/drain layer 56 from short-circuiting due to misalignment when subsequently performing a wafer bonding process, and it may be formed as any one selected from the group consisting of an oxide layer, a nitride layer and an oxynitride layer. Furthermore, the planarization process may be performed through chemical mechanical polishing.

Hereinafter, for the explanation purposes, a second structure including the sacrificial substrate 61 formed with the splitting layer 62, the stack patterns 66 and the word lines 71A will be referred to as a second wafer 600.

Figure 5I:
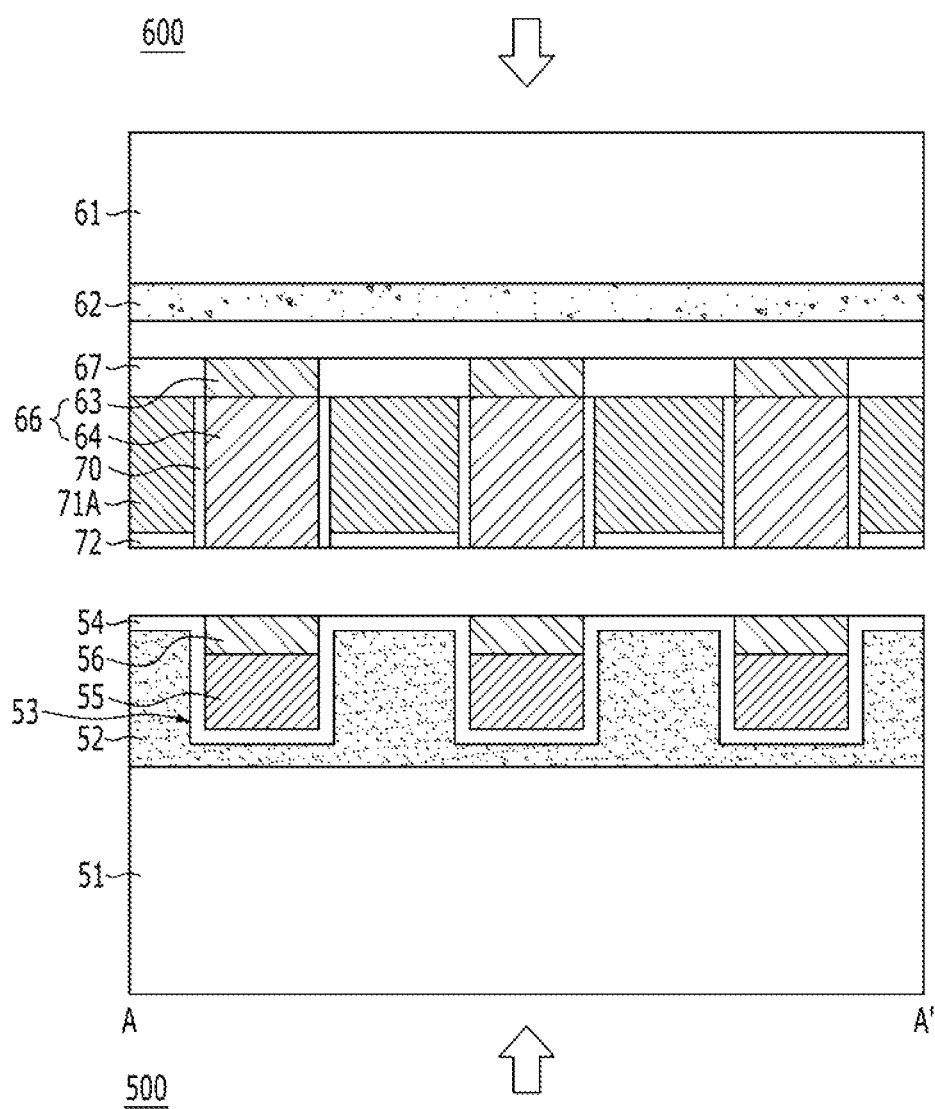
Figure 5J:
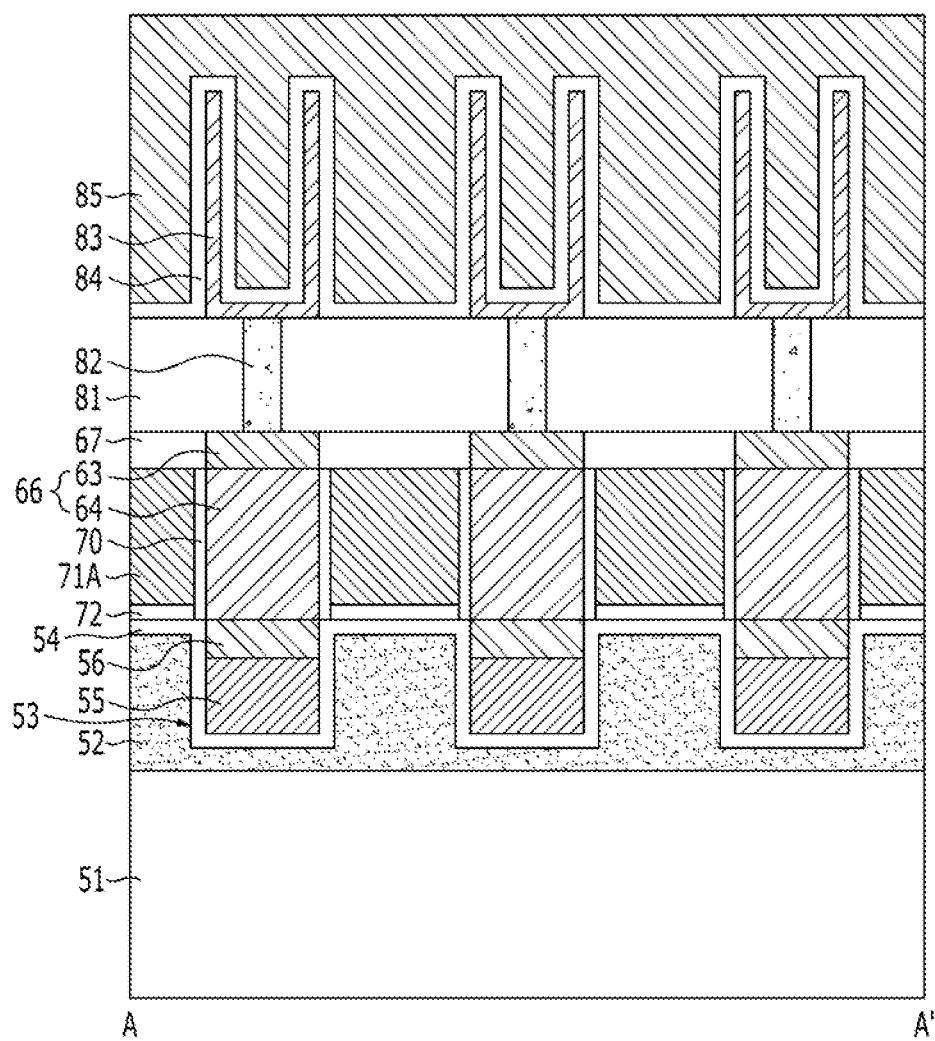
Figure 6I:
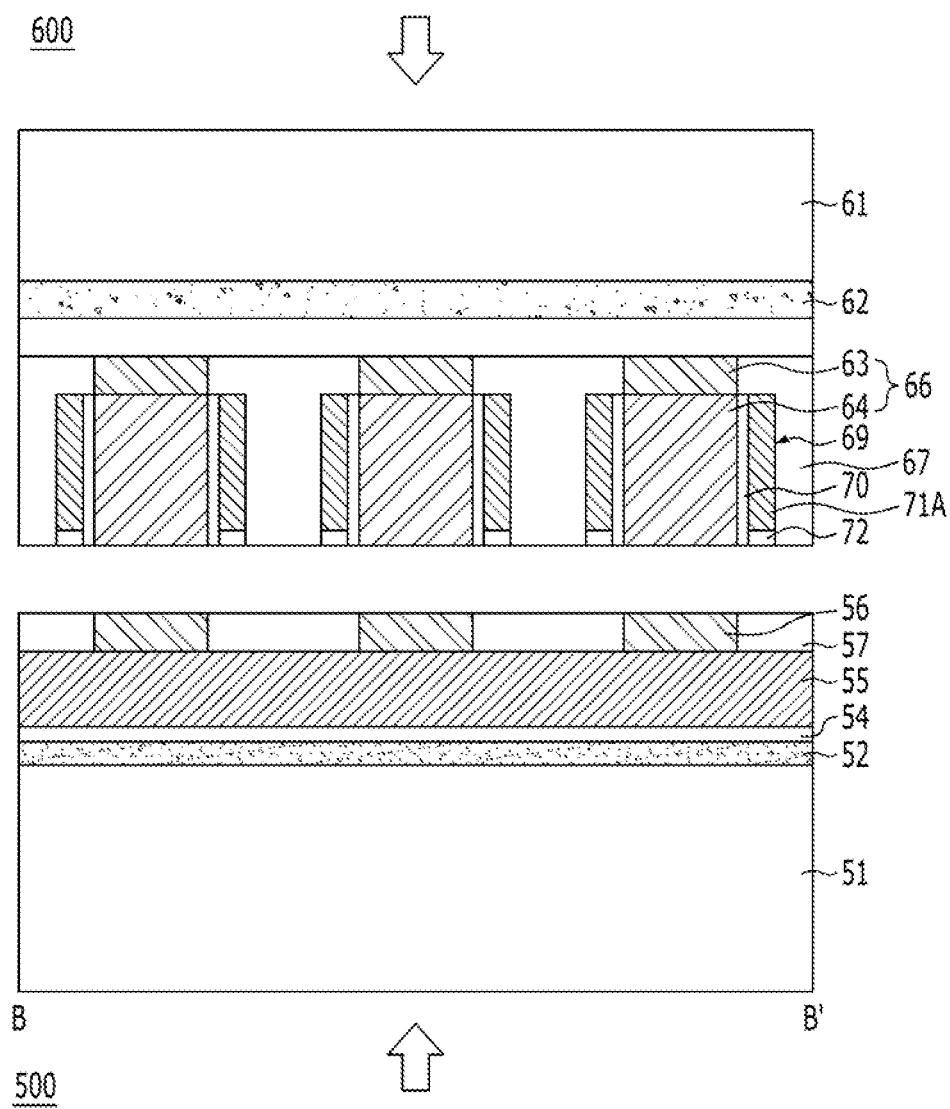
Figure 6J:
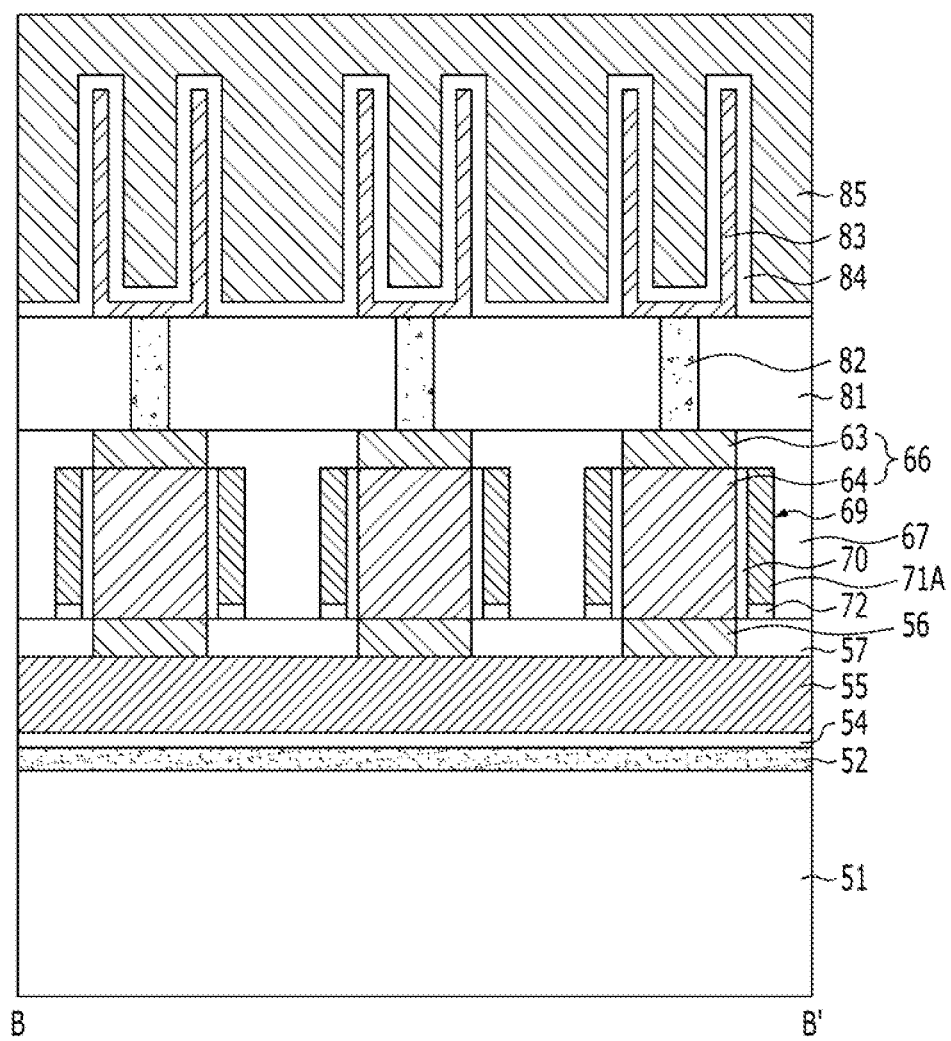

Referring to FIGS. 5I and 6I, after the surface of the first wafer 500, on which the first source/drain layer 56 is exposed, and the surface of the second wafer 600, on which the channel layer 64 is exposed, are aligned to face each other, the first wafer 500 and the second wafer 600 are bonded with each other such that the first source/drain layer 56 and the channel layer 64 of the stack patterns 66 contact with each other and the buried bit lines 55 and the word lines 71A cross with each other. Wafer bonding may be performed using various technologies generally known in the art. Before bonding the first and second wafers 500 and 600, given surface treatment may be performed so as to increase the adhesion force between them.

Referring to FIGS. 53 and 63, a cleaving process of applying a physical shock to the splitting layer 62 and removing the sacrificial substrate 61 is performed. The cleaving process may be performed using various technologies well known in the art.

Next, residues remaining after the cleaving process are removed. For example, by performing a planarization process until the surface of the second source/drain layer 63 is exposed, the splitting layer 62 and the sacrificial substrate 61 remaining after the cleaving process are removed, and then a cleaning process may be performed.

Then, after forming an interlayer dielectric layer 81 on the entire surface of the substrate 51, storage node contact plugs 82 are formed to be connected to the second source/drain layer 63 by penetrating the interlayer dielectric layer 81. The reason why the interlayer dielectric layer 81 is formed is to prevent a margin of a process for subsequently forming storage nodes 83 from decreasing since a sufficient gap is not secured between the storage nodes 83 and the word lines 71A or prevent operation characteristics from being degraded due to interference therebetween.

Next, by sequentially forming the storage nodes 83 on the interlayer dielectric layer 81 to contact with the storage node contact plugs 82, a dielectric layer 84 on the storage nodes 83 and a plate electrode 85 on the dielectric layer 84, a vertical channel semiconductor device with the buried bit lines 55 is completed.

According to the method for fabricating the semiconductor device in accordance with the embodiment of the present invention, the buried bit lines 55 with low resistance may be realized by forming the buried bit lines 55 as a metallic layer, and the low resistance buried bit lines 55 may be easily formed by bonding the stack patterns 66 to the substrate 51 formed with the buried bit lines 55.

Also, by realizing the vertical channel semiconductor device through bonding the buried bit lines 55 and the stack patterns 66, respective structures thereof are simple, whereby it is easy to increase the degree of integration, processes may be simplified, processing difficulties may be lessened, and applicability for mass production may be improved. Furthermore, the capacitance between adjacent buried bit lines 55 may be reduced.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   trenches defined in a substrate;
   buried bit lines partially filling the trenches;
   a first source/drain layer filling remaining portions of the trenches on the buried bit lines;
   stack patterns having a channel layer and a second source/drain layer stacked therein and bonded to the first source/drain layer, wherein the channel layer contacts with the first source/drain layer; and
   word lines crossing with the buried bit lines and disposed adjacent to sidewalls of the channel layer.

2. The semiconductor device according to claim 1, wherein the substrate includes a dielectric layer formed thereon, and the trenches are defined in the dielectric layer.

3. The semiconductor device according to claim 1, further comprising:
   a punch-through preventing layer formed in the substrate; and
   a dielectric layer formed on surfaces of the trenches.

4. The semiconductor device according to claim 3, wherein the trenches are defined in the punch-through preventing layer.

5. The semiconductor device according to claim 1, wherein a surface of the first source/drain layer and a surface of the substrate are flush with each other.

6. The semiconductor device according to claim 1, wherein the stack patterns are pillar type patterns are disposed at intersections of the word lines with the buried bit lines.

7. The semiconductor device according to claim 6, wherein the word lines extend in one direction and surround the channel layer of the stack patterns.

8. The semiconductor device according to claim 6, wherein the first source/drain layer is disposed between the stack patterns and the buried bit lines at the intersections.

9. The semiconductor device according to claim 8, further comprising:
   a dielectric layer filled in remaining portions of the trenches between portions of the first source/drain layer on the buried bit lines.

10. The semiconductor device according to claim 1, further comprising:
    a gate dielectric layer interposed between the channel layer and the word lines.

11. The semiconductor device according to claim 10, wherein the gate dielectric layer extends to lower surfaces of the word lines.

* * * * *